(12) United States Patent
Heath

(10) Patent No.: US 6,292,115 B1
(45) Date of Patent: *Sep. 18, 2001

(54) DATA COMPRESSION FOR USE WITH A COMMUNICATIONS CHANNEL

(75) Inventor: Robert Jeff Heath, San Diego, CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/359,272

(22) Filed: Jul. 22, 1999

Related U.S. Application Data

(60) Continuation-in-part of application No. 09/258,782, filed on Mar. 1, 1999, which is a division of application No. 08/982,864, filed on Dec. 2, 1997, now Pat. No. 5,955,976, which is a division of application No. 60/120,256, filed on Feb. 16, 1999.

(51) Int. Cl.[7] .................................................. H03M 7/00
(52) U.S. Cl. ............................................. 341/87; 341/51
(58) Field of Search ............................... 341/87, 51, 106, 341/67, 95, 50

(56) References Cited

U.S. PATENT DOCUMENTS 5,973,630 * 10/1999 Heath ........................................ 341/87

* cited by examiner

Primary Examiner—Brian Young
(74) Attorney, Agent, or Firm—Michael W. Sales; John T. Whelan

(57) ABSTRACT

A method, and apparatus for accomplishing the method, of compressing data for transmission over a communications channel involves receiving one or more data symbols comprising a current data string and at least one subsequent symbol; matching a longest previous data string with the current data string, the longest previous data string being defined by a code word; placing the code word into a compressed data stream; and extending the current data string by a plurality of symbols. Additional steps include: placing, in the event the current data string is the second occurrence of a two symbol string, a length field indicative of the plurality of symbols into the compressed data stream; placing, in the event the current data string is not the second occurrence of the two symbol string, a multi-symbol extension string signaling code word indicative of the plurality symbols into the compressed data stream; and transmitting the compressed data stream through the communications channel.

32 Claims, 17 Drawing Sheets

| COMPRESSION DICTIONARY | | | | |
|---|---|---|---|---|
| | EXTENSION | PARALLEL | LOCATION | COUNT |
| 0h | INVALID | | | |
| 1h | INVALID | | | |
| ⋮ | ⋮ | FIRST 256 ENTRIES OF COMPRESSION DICTIONARY ONLY HAVE AN EXTENSION POINTER | | |
| A | INVALID | | | |
| B | INVALID | | | |
| C | 100h | | | |
| D | INVALID | | | |
| ⋮ | ⋮ | | | |
| 100h | 108h | INVALID | 1 | 0 |
| 101h | INVALID | INVALID | 2 | 0 |
| 102h | INVALID | INVALID | 3 | 0 |
| ⋮ | ⋮ | ⋮ | ⋮ | ⋮ |
| 106h | INVALID | INVALID | 7 | 0 |
| 107h | INVALID | INVALID | 8 | 0 |
| 108h | INVALID | INVALID | B | 5 |
| ⋮ | ⋮ | ⋮ | ⋮ | ⋮ |
| 3ffh | | | | |

100         102         104         106

| DECOMPRESSION DICTIONARY | | |
|---|---|---|
| | LOCATION | DEPTH |
| 100h | 1 | 2 |
| 101h | 2 | 2 |
| 102h | 3 | 2 |
| ⋮ | ⋮ | ⋮ |
| 106h | 7 | 2 |
| 107h | 8 | 2 |
| 108h | 10h | 8 |
| ⋮ | ⋮ | ⋮ |
| 3ffh | | |

200    202

| | CODE WORD DICTIONARY | | | |
|---|---|---|---|---|
| | EXTENSION | PARALLEL | LOCATION | COUNT |
| 0h | RESERVED (801) | | | |
| 1h | | | | |
| 2h | | | | |
| 3h | Bh | - | 1 | 0 |
| 4h | - | - | 2 | 0 |
| 5h | - | - | 3 | 0 |
| 6h | - | - | 4 | 0 |
| 7h | - | - | 5 | 0 |
| 8h | - | - | 6 | 0 |
| 9h | - | - | 7 | 0 |
| Ah | - | - | 8 | 0 |
| Bh | - | - | B | 5 |
| Ch | - | - | - | - |
| Dh | - | - | - | - |
| Eh | - | - | - | - |
| Fh | - | - | - | - |
| 10h | - | - | - | - |
| ⋮ | ⋮ | ⋮ | ⋮ | ⋮ |
| 3FFh | - | - | - | - |

802  804  806  808

800

| ROOT NODE DICTIONARY | |
|---|---|
| | EXTENSION |
| 0h | INVALID |
| 1h | INVALID |
| ⋮ | ⋮ |
| "A" | INVALID |
| "B" | INVALID |
| "C" | 3h |
| "D" | INVALID |
| ⋮ | ⋮ |
| FFh | INVALID |

809  810

| DECOMPRESSION DICTIONARY | | |
|---|---|---|
| | LOCATION | DEPTH |
| 0h | RESERVED | |
| 1h | | |
| 2h | | |
| 3h | 1 | 2 |
| 4h | 2 | 2 |
| 5h | 3 | 2 |
| ... | ... | ... |
| 9h | 7 | 2 |
| Ah | 8 | 2 |
| Bh | 10h | 8 |
| ... | ... | ... |
| 3ffh | | |

DATA COMPRESSION FOR USE WITH A COMMUNICATIONS CHANNEL

BACKGROUND OF THE INVENTION

This application is a continuation-in-part of application Ser. No. 09/258,782 filed on Mar. 1, 1999 which is a Divisional of application Ser. No. 08/982,864 filed on Dec. 2, 1997 U.S. Pat. No. 5,955,476, the entire contents of which are hereby incorporated by reference. This application also claims priority under 35 U.S.C. 119(e) of the filing date of the U.S. Provisional Application No.: 60/120,256 filed Feb. 16, 1999.

The present invention relates to data compression (i.e., creation of compressed data from uncompressed data) and decompression (i.e., recovery of the uncompressed data from the compressed data).

Data compression systems are known in the prior art that compress a stream of digital data signals (uncompressed bits) into compressed digital data signals (compressed bits), which require less bandwidth (fewer bits) than the original digital data signals, and that decompress the compressed digital data signals back into the original data signals or a close approximation thereof. Lossless data compression systems decompress the compressed digital data signals back into the original data signals exactly. Thus, lossless data compression refers to any process that converts data into an alternative data form that requires less bandwidth, i.e., has fewer bits, than the data converted in a process that is reversible so that the original data can be recovered.

Accordingly, the objective of data compression systems is to effect a savings in an amount of storage required to hold the data or the amount of time (or bandwidth) required to transmit the data. By decreasing required space for data storage or required time (or bandwidth) for data transmission, data compression results in a monetary and resource savings.

A compression ratio is defined as the ratio of the length of the data in the alternative data form (compressed data) to the length of the data originally (original data). Thus defined, the smaller the compression ratio, the greater will be the savings in storage, time, or bandwidth.

If physical devices such as magnetic disks or magnetic tape are utilized to store the data, then a smaller space is required on the device for storing the compressed data than would be required for storing the original data, thereby, e.g., utilizing fewer disks or tapes for storage. If telephone lines, satellite links or other communications channels are utilized for transmitting digital information, then lower costs, i.e., shorter transmission times and/or smaller bandwidths, result when compressed data is employed instead of original data.

Data compression systems can be made particularly effective if the original data contains redundancies such as having symbols or strings of symbols appearing with high frequency. (In fact redundancies in the original data is a requirement for lossless data compression.) A data compression system operating on original data containing redundancies may, for example, transform multiple instances of a symbol, or transform a string of symbols, in the original data into a more concise form, such as a special symbol or group of symbols indicating multiple occurrences of the symbol, or indicating the string of symbols, and thereafter translate or decompress the concise form back into the multiple instances of the symbol, or back into the string of symbols.

For example, it may be desirable to transmit the contents of a daily newspaper via a satellite link or other communications link to a remote location for printing. Appropriate sensors within a data compression system may convert the contents of the newspaper into a data stream of serially occurring characters for transmission via the satellite link. If the millions of bits comprising the contents of the daily newspaper were compressed before transmission and decompressed at the receiver, a significant amount, e.g., such as 50% or more, of transmission time (or bandwidth) could be saved.

As a further example, when an extensive database such as an airline reservation database or a banking system database is stored for archival or backup purposes, a significant amount of storage space, such as 50% or more, can be saved if the database files are compressed prior to storage and decompressed when they are retrieved from storage.

To be of practical and general utility, a digital data compression system should satisfy certain criteria. Specifically, one criterion is that the system should provide high performance, i.e., compression/decompression rates, for both compression and decompression with respect to the data rates in the communications channel being utilized, be it a data bus, a wired network, a wireless network or the like. In other words, data transmission rates seen by a sender of uncompressed data and a receiver of the uncompressed data should not be reduced as a result of compression/ decompression overhead. In fact, effective data rates achieved, may be significantly increased over slow communications channels, because more original data can be transmitted per unit time, if the original data is compressed preceding and following transmission, because there is less compressed data to transmit that there would have been original data.

The rate at which data can be compressed (i.e., the compression rate) is the rate at which the original data can be converted into compressed data typically specified in millions of bytes per second (megabytes/sec). The rate at which data can be decompressed (i.e., the decompression rate) is the rate at which compressed data can be converted back into original data. High compression rates and high decompression rates are necessary to maintain, i.e., not degrade, data rates achieved in present day disk, tape and communication systems, which typically exceed one megabyte/sec. Thus, practical data compression systems must typically have compression and decompression rates matching or exceeding some application-dependent threshold, e.g., one megabyte/sec.

The performance of prior art data compression systems is typically limited by the speed of the random access memories (RAM) and the like utilized to store statistical data and guide the compression and decompression processes. High performance compression rates and decompression rates for a data compression system can thus be characterized by a number of cycles (read and write operations) required per input character into or out of the data compression system. Fewer memory cycles per input character leads to higher performance compression rates and decompression rates.

Another important criterion in the design of a data compression and decompression system is compression effectiveness. Compression effectiveness is characterized by the compression ratio of the system, i.e. a smaller compression ratio indicates greater compression effectiveness. However, in order for data to be compressible using a lossless data compression system, the data to be compressed must contain redundancies. As a result, the compression ratio, or compression effectiveness, in a lossless data compression system (and to a lesser degree in a lossy data compression system) is a function of the degree of redundancy in the data being compressed. The compression effectiveness of any data compression system is also affected by how effectively the data compression system exploits, for data compression purposes, the particular forms of redundancy in the original data.

In typical computer stored data, e.g., arrays of integers, text, programs or the like, redundancy occurs both in the repetitive use of individual symbology, e.g., digits, bytes or characters, and in frequent recurrence of symbol sequences, such as common words, blank record fields, and the like. An effective data compression system should respond to both types of redundancy.

A further criterion important in the design of data compression and decompression systems is that of adaptability. Many prior art data compression procedures require prior knowledge, or the statistics, of the data being compressed. Some prior art procedures adapt to the statistics of the data as it is received, i.e., adaptive data compression systems, and others do not, i.e., non-adaptive data compressions systems. Where prior art procedures do not adapt to the statistics of the data as it is received, compression effectiveness is reduced, but where such procedures do adapt to the statistics, an inordinate degree of complexity is required in the data compression system. An adaptive data compression system may be utilized over a wide range of information types, which is typically the requirement in general purpose computer facilities while a non-adaptive data compression system operates optimally only on data types for which the non-adaptive data compression system is optimized.

Thus, it is desirable that the data compression system achieves small compression ratios without prior knowledge of the data statistics, i.e., that the data compression system is adaptive. Many data compression systems currently available are generally not adaptable and so cannot be utilized to achieve small compression ratios over a wide range of data types.

General purpose data compression procedures are known in the prior art that either are or may be rendered adaptive, two relevant procedures being the Huffman method and the Tunstall method. The Huffman method is widely known and used, reference thereto being had in an article by D. A. Huffman entitled "A Method for the Construction of Minimum Redundancy Codes", *Proceedings Ire,* 40:10, pp. 1098–1100 (September 1952). Further reference to the Huffman procedure may be had in an article by R. Gallagher entitled "Variations on a Theme by Huffman", *IEEE Information Theory Transactions,* IT-24:6, (November 1978). Adaptive Huffman coding maps fixed length sequences of symbols into variable length binary words. Adaptive Huffman coding suffers from the limitation that it is not efficacious when redundancy exists in input symbol sequences which are longer than the fixed sequence length the procedure can interpret. In practical implementations of the Huffman procedure, the input sequence lengths rarely exceed 12 bits due to RAM costs and, therefore, the procedure generally does not achieve small compression ratios. Additionally, the adaptive Huffman procedure is complex and often requires an inordinately large number of memory cycles for each input symbol. Thus, the adaptive Huffman procedure tends to be undesirably cumbersome costly and slow thereby rendering the process unsuitable for most practical present day installations.

Reference to the Tunstall procedure may be had in the doctoral thesis of B. T. Tunstall entitled "Synthesis of Noiseless Compression Codes", *Georgia Institute of Technology,* (September 1967). The Tunstall procedure maps variable length input system sequences into fixed length binary output words. Although no adaptive version of the Tunstall procedure is described in the prior art, an adaptive version could be derived which, however, would be complex and unsuitable for high performance implementations. Neither the Huffman nor the Tunstall procedure has the ability to encode increasingly longer combinations of source symbols.

A further adaptive data compression system that overcomes some of the disadvantages of the prior art is that disclosed in U.S. Pat. No. 4,464,650 for APPARATUS AND METHOD FOR COMPRESSING DATA AND RESTORING THE COMPRESSED DATA, issued Aug. 7, 1984 to Cohen. The procedure of Cohen parses the stream of input data symbols into adaptively growing sequences of symbols. The procedure unfortunately, however, suffers from the disadvantages of requiring numerous RAM cycles per input character and utilizing time consuming and complex mathematical procedures such as multiplication and division to effect compression and decompression. These disadvantages tend to render the Cohen procedure unsuitable for numerous economical high performance implementations.

An even further adaptive data compression system that overcomes some of the disadvantages of the prior art is that disclosed in U.S. Pat. No. 4,558,302 for HIGH SPEED DATA COMPRESSION AND DECOMPRESSION APPARATUS AND METHOD, issued Dec. 10, 1985, to Welch. The procedure of Welch compresses an input stream of data symbols by storing, in a string table, strings of symbols encountered in an input stream. The Welch procedure next searches the input stream to determine the longest match to a stored string of symbols. Each stored string of symbols includes a prefix string and an extension character that is a last character in the string of symbols. The prefix string includes all but the extension character.

When a longest match between the input data stream and the stored strings of symbols is determined, the code signal for the longest match is transmitted as the compressed code signal for the encountered string of symbols and an extension character is stored in the string table. The prefix string of the extension character is the longest match, i.e., the longest stored string of symbols located in the search. The extension character of the extended string is the next input data character signal following the longest match.

Searching through the string table and entering extension characters into the string table is effected by a limited searching hashing procedure. Unfortunately, even the improved data compression system of Welch suffers from less than optimal compression effectiveness, and less than optimal performance. As a result, the Welch procedure, like the Cohen procedure, is unsuitable for many high performance implementations.

SUMMARY OF THE INVENTION

The present invention advantageously improves upon the above-described approaches by providing a lossless data compression (i.e., creation of compressed data from uncompressed data) and decompression (i.e., recovery of the uncompressed data from the compressed data) approach that improves on heretofore known data compression and decompression approaches.

In one embodiment, the present invention can be characterized as a method, and related apparatus, of data compression for transmission over a communications channel. The method includes the steps of receiving one or more data symbols comprising a current data string and at least one subsequent symbol; matching a longest previous data string with the current data string, the longest previous data string being defined by a code word; placing the code word into a compressed data stream and extending the current data string by a plurality of symbols. Furthermore, additional steps include: placing, in the event the current data string is the second occurrence of a two symbol string, a length field indicative of the plurality of symbols into the compressed data stream; placing, in the event the current data string is not the second occurrence of the two symbol string, a multi-symbol extension string signaling code word indicative of the plurality symbols into the compressed data stream; and transmitting the compressed data stream through the communications channel.

In another embodiment, the present invention can be characterized as method of data compression for transmission over a communications channel. The method includes the steps of receiving one or more data symbols comprising a current data string; matching a longest previous data string with the current data string; placing, in the event the longest previous data string having been matched is a single symbol, the single symbol into a compressed data stream; placing, in the event the longest previous data string having been matched is a multiple symbol data string, a code word into the compressed data stream, the code word indicative of the longest previous data string; and transmitting the compressed data stream through the communications channel.

In a further embodiment, the present invention can be characterized as a method, and related apparatus, for decompressing data received over a communications channel. The method includes the steps receiving a plurality of bits; determining whether the plurality of bits represents a single symbol or a code word; placing, in the event the plurality of bits represents the single symbol, the single symbol into an output data stream; and placing, in the event the plurality of bits represents the code word, a data string defined by the code word into the output data stream. Furthermore, additional steps include receiving an identifying bit and a plurality of subsequent bits; and determining, using said identifying bit, whether said plurality of subsequent bits represents said single symbol or said code word.

In yet another embodiment, the present invention can be characterized as an adaptive compression dictionary to be used for compressing data to be transmitted through a communications channel comprising a code word dictionary and a root node dictionary. The code word dictionary comprises: an extension pointer for pointing to a code dictionary entry that defines an extension string to a current string wherein the extension string is one or more symbols; a parallel pointer for pointing to a code dictionary entry that defines a parallel extension string to the current string, wherein the parallel extension string is one or more symbols; a location pointer for pointing to a location of a first symbol of the extension string in a previously compressed area of an input data stream; and a count indicative of a number of symbols in the extension string. The root node dictionary comprises a root extension pointer for pointing to a code dictionary entry that defines an extension string to a single symbol, wherein the extension string is one symbol.

In yet another embodiment, the present invention can be characterized as a method for a compressor to enter and exit a transparent mode in a data compression system. The method includes the following steps: determining whether the transparent mode should be entered; placing, in the event the transparent mode is to be entered, an enter transparent mode code word into an output data stream; placing a predetermined number of symbols received from an input data stream into the output data stream, wherein the predetermined number of symbols are uncompressed in the output data stream; and reentering a compression mode after the placing the predetermined number of symbols step.

BRIEF DESCRIPTION OF THE DRAWINGS

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE PREFERRED EBMODIMENTS

The following description of the presently contemplated best mode of practicing the invention is not to be taken in a limiting sense, but is made merely for the purpose of describing the general principles of the invention. The scope of the invention should be determined with reference to the claims.

Figure 1:
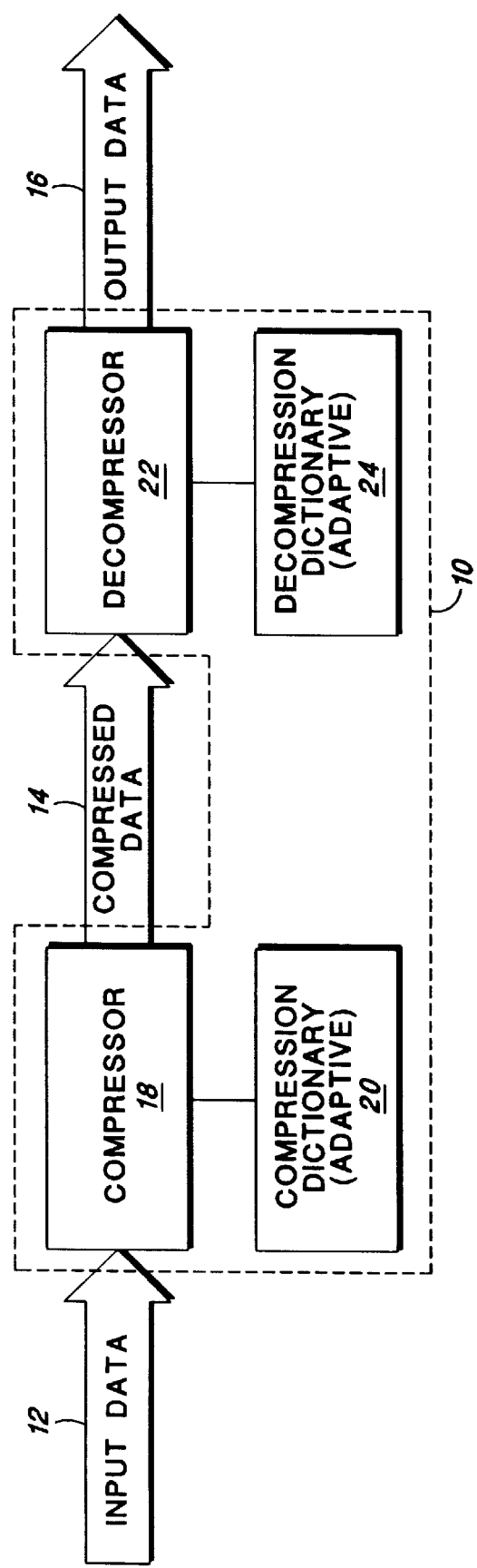
FIG. 1 is a block diagram illustrating a data compression system in accordance with one embodiment of the present invention

Referring to FIG. 1, a block diagram is shown of functional components of a data compression system in 10 combination with an input data stream 12, a data channel 14 and an output data stream 16, in accordance with one embodiment of the present invention. Shown is the input data stream 12, a compressor 18, a compression dictionary 20, the data channel 14 carrying compressed data, a decompressor 22, a decompression dictionary 24 and the output data stream 16. The compressor 18, the compression dictionary 20, the decompressor 22 and the decompression dictionary 24 together make up the data compression system 10. Advantageously, the data compression 10 system may be implemented using a general purpose computer or a special purpose computer (or other processor-and-memory-containing system, such as a satellite transmitter and receiver, cellular base station and cellular telephone, or the like) and appropriate software subsystems.

EMBODIMENT A

In accordance with one embodiment of the data compression system 10, the first, for example, 256 code words of, for example, 1024 possible assignable code words are reserved for 256 possible hexadecimal character code representations of an 8 bit byte character. For example, the first 256 code words may be assigned to extended ASCII (American Standard Code for Information Interchange) symbols, EBCDIC (Extended Binary Coded Decimal for Interchange Code) symbols, or the like. Thus, in accordance with the present embodiment, 768 code words, of the 1024 possible assignable code words, are available for assignment as dictionary entries to recurring strings of bytes (i.e., redundancies) built as character patterns are encountered within data to be compressed, i.e., during compression of the input data stream 12, or code words are processed within already compressed data, i.e., during decompression of the compressed data stream 14. These 768 code words are built and stored in the compression dictionary 20 during compression and built and stored in the decompression dictionary 24 during decompression.

This embodiment stops building dictionary entries and extending strings when the 1024th code word is built, however, this is a matter of design choice and can be adapted to particular applications of the embodiment. With particular sizes of data streams, optimal performance may be achievable by, for example, employing 512, 2048, 4096 or more code words. The code words, however many, along with their assigned character bytes or recurring strings of bytes (or, more accurately, their assigned pointers to assigned character bytes or recurring strings of bytes within the input data stream 12) make up the compression dictionary 20, which is used to translate data to be compressed (original data, i.e., the input data stream) into compressed data (i.e., the compressed data stream), and the decompression dictionary 24, which is used to translate the compressed data back into the original data (i.e., the output data stream).

The data compression system employs structure for the compression dictionary 20 that is different from the structure of the decompression dictionary 24. The compression dictionary 20 is defined according to the following elements illustrated in FIG. 2:

EXTENSION POINTER (100)—A pointer to a compression dictionary entry that defines an "extension string" to a current string. There are 1024 extension pointers each associated with a compression dictionary entry, and each compression dictionary entry is associated with a code word. The first 256 compression dictionary entries, which are associated with the first 256 code words, are reserved for the 256 hexadecimal representations of an 8 bit byte, and only have an extension pointer, i.e., they do not have a parallel pointer, location pointer or count (see below). The remaining 768 compression dictionary entries, associated with the remaining 756 code words, have an extension pointer and a parallel pointer.

PARALLEL POINTER (102)—A pointer to a compression dictionary entry that defines an "extension string" to a previous string, a parallel string, i.e., a string that starts with the same character or characters as the current string and, thus, has the same previous string entry as the current string. There are 768 parallel pointers, associated with code words 256 through 1023.

LOCATION POINTER (104)—A pointer, into a previously compressed area of the input data stream, to a location of a first character of one or more extension characters of an extension string defined by a compression dictionary entry. There are 768 such pointers, for code words 256 through 1023.

COUNT (106)—A number of characters, in addition to the character pointed to by the location pointer, defined by a compression dictionary entry.

The compressor 18 initializes the compression dictionary 20 by placing an illegal pointer value into the EXTENSION POINTER (100) of the first 256 dictionary entries. These are the entries reserved for the 256 possible hexadecimal representations of an 8 bit byte. No other initialization is required.

Figures 2, 3:
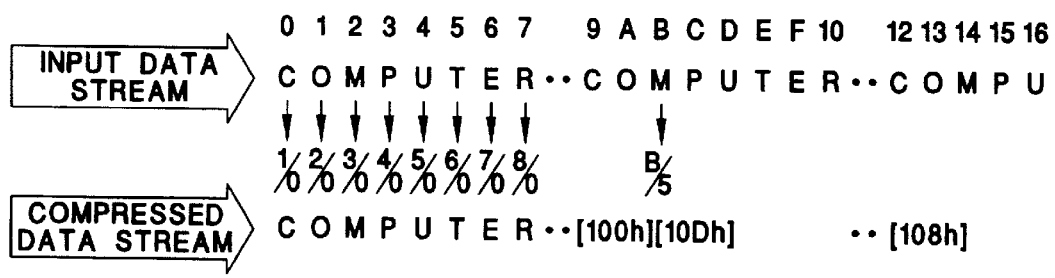
FIG. 2 is a tabular representation of a compression dictionary generated by the data compression system of FIG. 1.
FIG. 3 is a tabular representation of exemplary input (or original) data suitable for compression with the data compression system of FIG. 1.

Referring to FIG. 3, an illustration is shown of an exemplary input data stream in response to which the compression dictionary in FIG. 2 is generated.

Figures 4, 5:
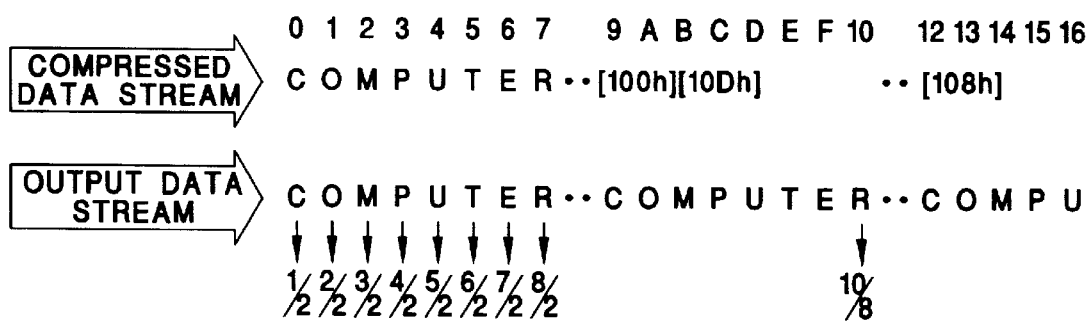
FIG. 4 is a tabular representation of a decompression dictionary generated by the data compression system of FIG. 1.
FIG. 5 is a tabular representation of exemplary compressed data generated by the data compression system of FIG. 1 in response to the input data of FIG. 3.

The decompression dictionary 24 structure is different than that of the compression dictionary 20 and is defined according to the following elements illustrated in FIG. 4:

LOCATION POINTER (200)—A pointer, into a previously decompressed area of the output data stream that points to a last character of a string of characters defined by a code word and a decompression dictionary entry. There are 768 such pointers, for code words 256 through 1023.

DEPTH (202)—A word that contains a number of characters in a string, the last of which characters is at the location in the previously decompressed area of the output data stream pointed to by the location pointer, defined by a code word and a dictionary entry. The decompressor subtracts the depth minus one from the location pointer to determine the first character of the string defined by the code word being processed. There are 768 such words, for code words 256 through 1023.

The decompression dictionary requires no initialization.

Code words are assigned in increasing sequential numerical order starting with 256, or 100 hexadecimal (h), and ending with 1023, or 3FFh. Code words 0, or 0h, through 255, or FFh, are reserved for the 256 possible hexadecimal representations of an 8 bit byte.

Referring to FIG. 5, an illustration is shown of an exemplary compressed data stream generated by the compressor 18 in response to the input data stream of FIG. 4.

Figure 6A:
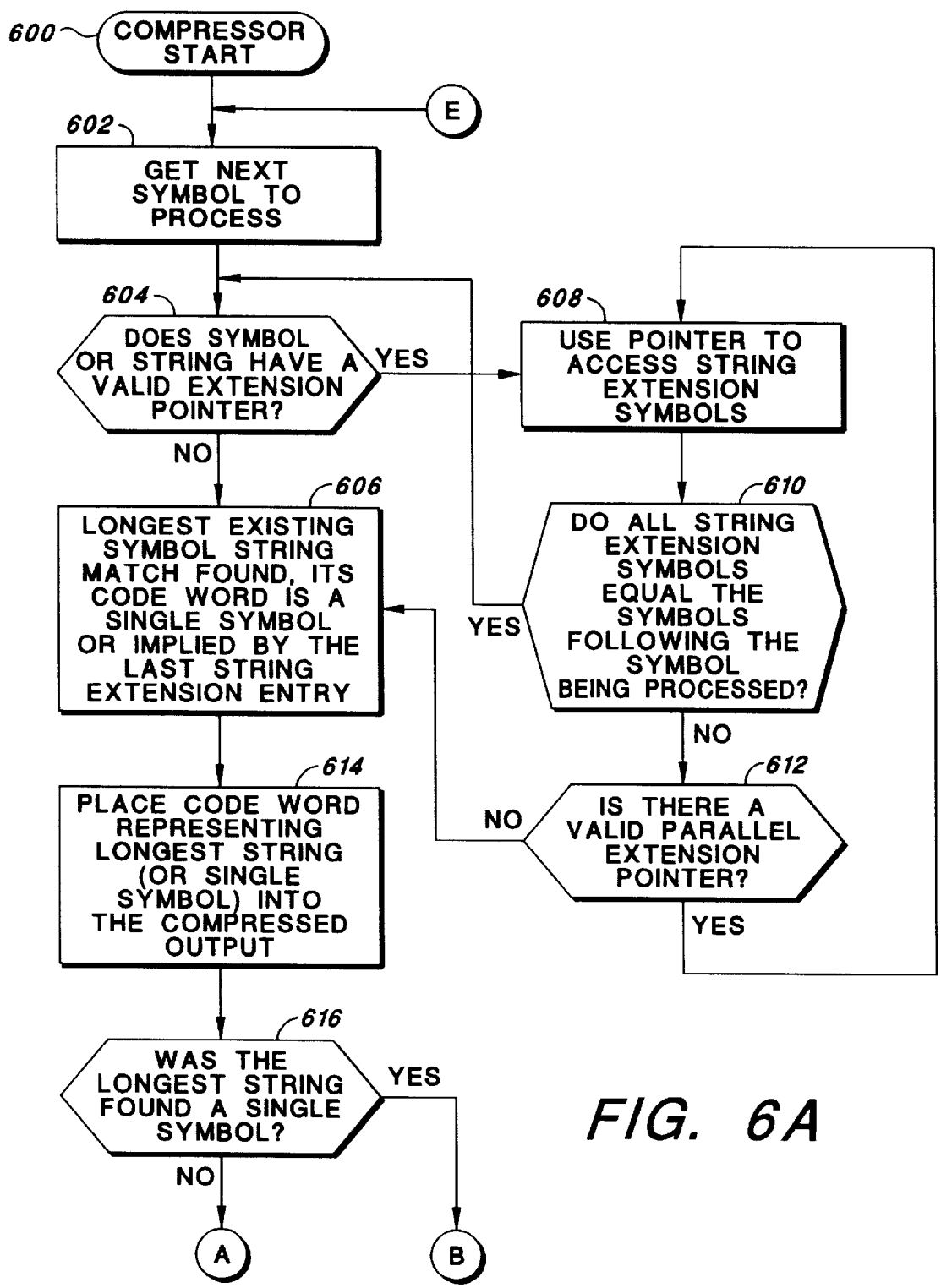
FIGS. 6A, 6B and 6C are flow charts illustrating steps traversed by the data compression system of FIG. 1 in order to compress an input data stream.
Figure 6B:
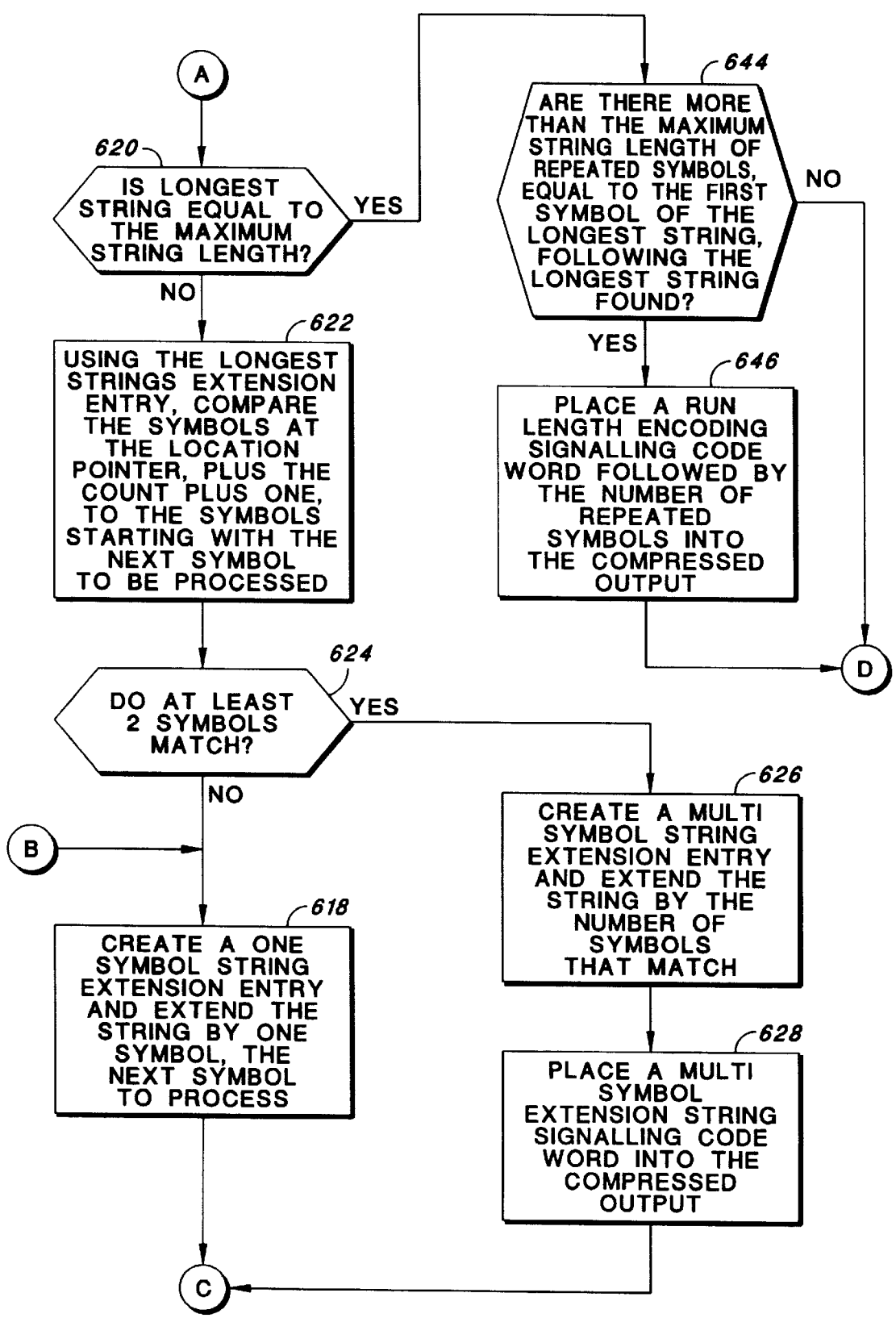
Figure 6C:
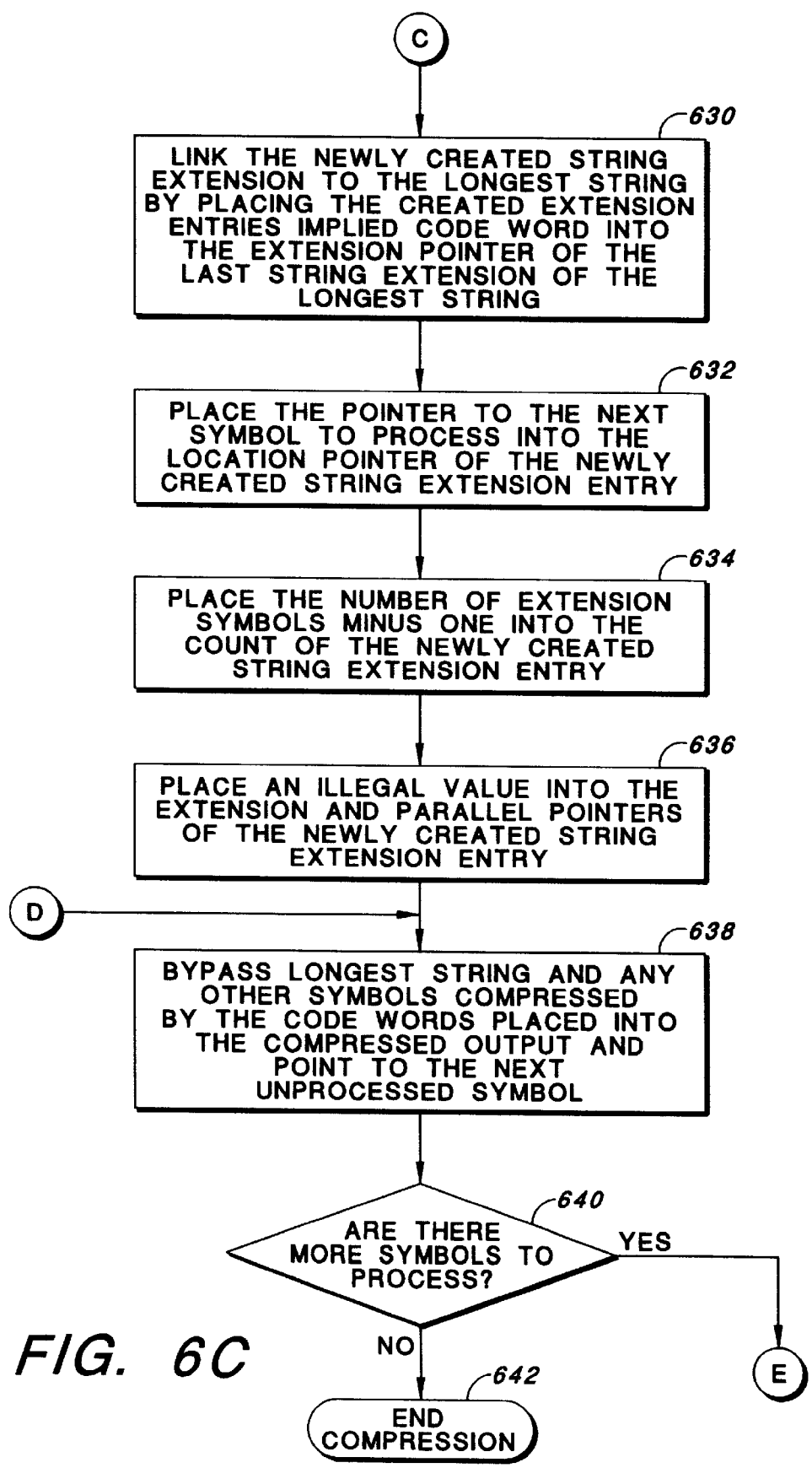

Referring to FIGS. 6A, 6B and 6C, a flowchart is shown of steps traversed by one variation of the compressor during a compression operation. The compressor starts (Block 600)

with a first symbol or character in the input data stream, making a single pass through the input data stream, processing one or more symbols at a time (Block 602), and building the compression dictionary with the individual symbols and repeated strings of symbols it encounters, as follows:

1. The compressor 18 finds a longest previously encountered string of symbols that matches a string of symbols that starts with a symbol currently being processed as follows:
   1. The compressor 18 determines (Block 604) if the character being processed has been encountered previously in the data stream, by using the hexadecimal value of the symbol as an index into the compression dictionary to check the value of its entry's EXTENSION POINTER (100) (string extension entry).
   2. If the extension pointer 100 has an illegal value (Block 606), the symbol has not been encountered previously and the longest existing string match is found, a single symbol.
   3. If the EXTENSION POINTER (100) has a legal value (Block 608), the symbol has been encountered previously and points to a string extension entry that defines additional string symbols for comparison.
   4. Using the EXTENSION POINTER (100) to access the string extension's dictionary entry, the compressor determines (Block 610) if the symbols defined by the string extension'S dictionary entry are equal to the symbols following the symbol being processed. The first symbol defined by the string extension's dictionary entry is pointed to in the input data stream by the dictionary entry's location pointer, and the number of symbols in the dictionary entry is the dictionary entry's count plus one.
   5. If all symbols defined by the string extension's dictionary entry are equal to the symbols following the symbol being processed (Block 610), processing continues (Block 604) with step 3 above. All such equal symbols are bypassed to get to a next symbol to be processed.
   6. If all the symbols defined by the dictionary entry are equal to the symbols following the symbol being processed (Block 610), and the extension pointer (100) of the string extension's dictionary entry is an illegal value (Block 604), the longest string match has been found (Block 606). The longest string match is a string of symbols that is represented by the code word assigned to the dictionary entry defining the entry for which all symbols represented match the symbols following the symbol being processed in the input data stream.
   7. If not all the symbols defined by the string extension's dictionary entry are equal to the symbols following the symbol being processed (Block 610), the dictionary entry's parallel pointer (102) is checked (Block 412) to determine if there is another dictionary entry that starts with the same symbols (Block 608 and 610), and thus has different string extension symbols.
   8. If the parallel pointer (102) is an illegal value (Block 612), the longest siring match has been found (Block 606), which is represented by the previous string extension's code word. If the previous string extension is the symbol being processed, the longest string match found is a single symbol.
   9. If the parallel pointer (102) is a legal value (Block 612), the compressor uses it to access (Block 608) the parallel string's dictionary entry. The compressor determines if the symbols defined by the parallel string's location pointer and count are equal to the symbols following the symbol being processed (Block 610). The steps starting at step 5, above, are then repeated.

2. The compressor then places (Block 614) a code word representing the longest string match into a compressed data stream, which is output by the compressor. The code words are shifted and packed into the compressed data stream as the longest string matches are determined.

3. The compressor then extends the longest string match by as many symbols as possible as follows:
   1. If the longest string match is a single symbol (Block, 616), that string is extended by one symbol (Block 618) by linking the next symbol to process as a one symbol string extension to the longest string match, i.e., the single symbol.
   2. If the longest string match is a multiple symbol string (Block 616), and is not already at a maximum string length (Block 620), the compressor attempts to extend that longest string match by as many symbols as possible (Block 622). Using the location pointer (104) of the last string extension entry of the longest string match, the dictionary entry defined by the code word for the longest string match placed into the compressed data stream, the compressor determines how many symbols following the last symbol of the longest string match are equal to the next symbols in the input data block stream.
   3. The compressor then compares (Block 622) the symbols pointed to by adding the location pointer (104) to the count (106) plus one, for the dictionary entry of the code word placed into the compressed data stream, to symbols starting with a next symbol in the input data stream to be processed.
   4. If one or no symbols match (Block 624), the longest string match is extended by one symbol by linking (Block 618) the next symbol to process as a one symbol extension to the longest string match.
   5. If two or more characters match (Block 624), the compressor extends the longest string match by as many symbols as match (Block 626), and places (Block 628) an extended string signaling code word into the compressed data stream. The extended string signaling code word indicates the number of symbols by which the longest string match is to be extended. The signaling code word is a code word that is greater than a last code word, i.e., last dictionary entry, built by an increment that equals the number of symbols by which the longest string match is to be extended.

4. The compressor builds a string extension to the longest string match by using the next sequential unbuilt dictionary entry, i.e., next unbuilt code word entry, as follows:
   1. Linking the string extension to the longest string (Block 630) by placing a code word implied by a relative position of a new string extension entry into the EXTENSION pointer (100) of the last string extension of the longest string.
   2. Placing a pointer to a next symbol to process in the data block into the LOCATION pointer (104) (Block 632). This points to a first symbol of the string extension.
   3. Placing the number of extension symbols minus one into the COUNT (106) (Block 634).
   4. Placing an illegal pointer value into the EXTENSION POINTER (100) and the PARALLEL pointer (102) (Block 636).

5. If the string was extended by multiple symbols, bypass (Block 638) those symbols (i.e., the longest string and any other characters compressed) to get to the next symbol to process.
6. Start over again (Block 640) with the next symbol to process, if there is such a symbol, trying to find the longest string or, if there are no more symbols to process, terminating the compressor (Block 642).

The mechanism described above to extend the longest string found is applicable for extending strings by many symbols, not just one symbol at a time. Each code word skipped by an extended string signaling code word indicates an additional character by which the previous string of symbols is extended. The extended string signaling code word can represent as many characters as there are code words yet to be built. For example, if the last code word built is 205h, a string can be extended by 20 (decimal) characters by sending an extended string signaling code word of 219h (20 decimal is 14h and 205h plus 14h is 219h). The extended string signaling code word, at the time the extended string signaling code word is used, is just that, a signal, the dictionary entry for the extended string signaling code word, at the time the extended string signaling code word is used, is not actually built yet by either the compressor or the decompressor. The next unused dictionary entry, following the last used dictionary entry, is used to build the multiple symbol string extension of the previous code word's string, the string extension implied by the extended string signaling code word. Once built, this dictionary entry is used in lieu of the extended string signaling code word, thus making usage of any given extended string signaling code word for a given string of symbols a one-time occurrence.

In the present embodiment, extended string signaling is limited by 9 to 10 bit, etc. code word boundaries. Thus, if the last code word built is 1F1h the extended string limit is 14 characters because the last 9 bit code word is 1FFh. 9 bit code words are used in the compressed output until the last 9 bit code word is built, and thus a 10 bit signaling code word is not used to extend a string until code word 1FFh is built. In other embodiments, extended string signaling is not limited by 9 to 10 bit, etc. code word boundaries.

The decompressor builds its dictionary using the characters and code words output by the compressor after they are received over the data channel 14. In accordance with the present embodiment, the dictionary entries and code words must reflect the same information that the compressor 18 used when building the compression dictionary 20 and they both should keep pace with one another.

A major difference between the compression dictionary 20 built by the compressor 18 and the decompression dictionary 24 built by the decompressor 22 is that the entries in the compression dictionary 20 are built by the compressor 18 for an extension string when the compressor 18 finds and processes the current longest string. However, the decompressor 22 must wait until it gets the next code word to extend the symbol string represented by the current code word.

The decompression dictionary 24 only contains string extension code words, i.e., those code words from 100h through 3FFh. The decompression code words are implied from the relative position of their corresponding dictionary entries within the decompression dictionary 24. However, since the first entry in the decompression dictionary 24 is code word 100h, the implied code word is the relative position of the entry in the dictionary offset by 100h.

Figure 7A:
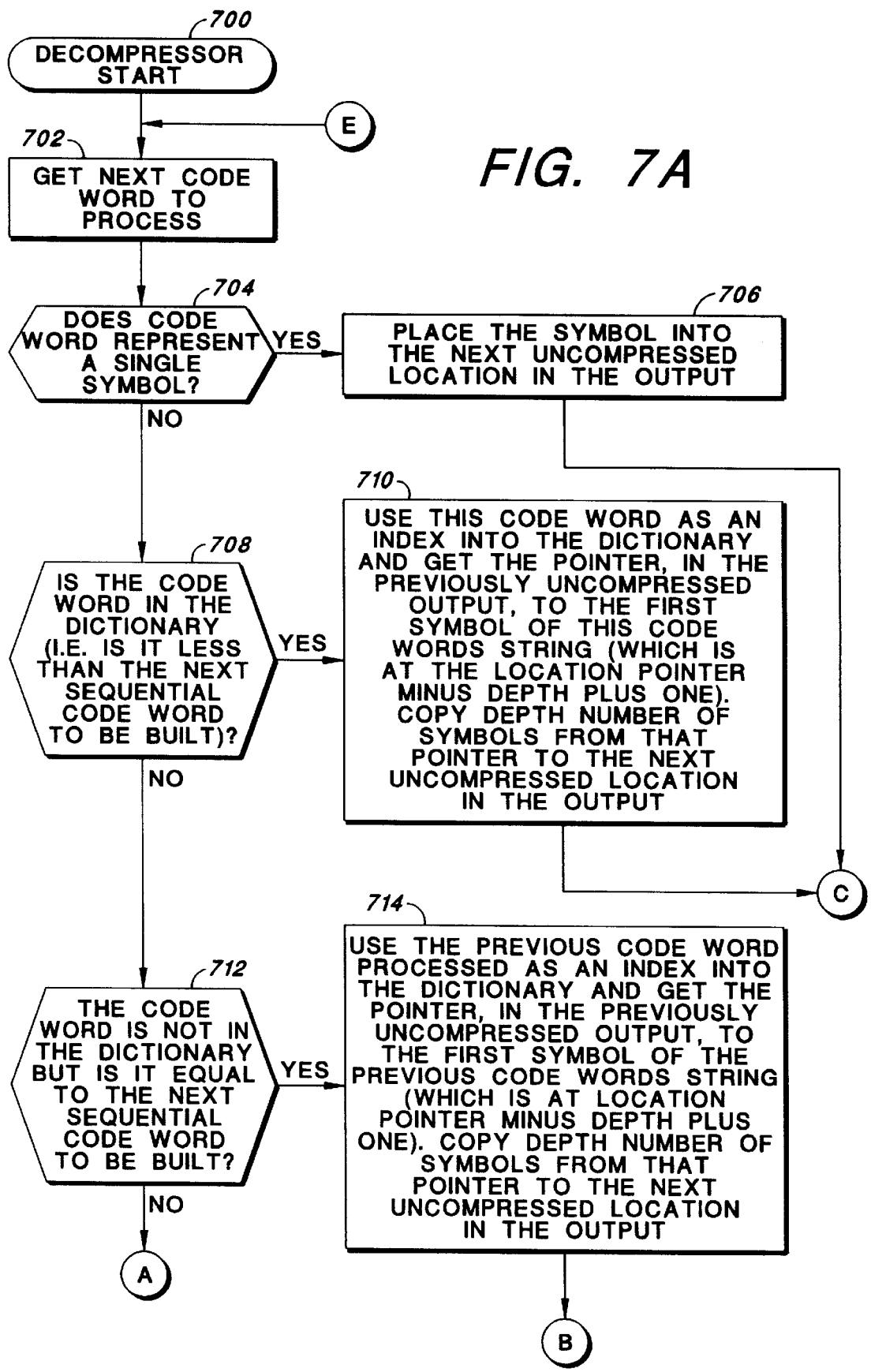
FIGS. 7A, 7B and 7C are flow charts illustrating steps traversed by the data compression system of FIG. 1 in order to decompress a compressed data stream.
Figure 7B:
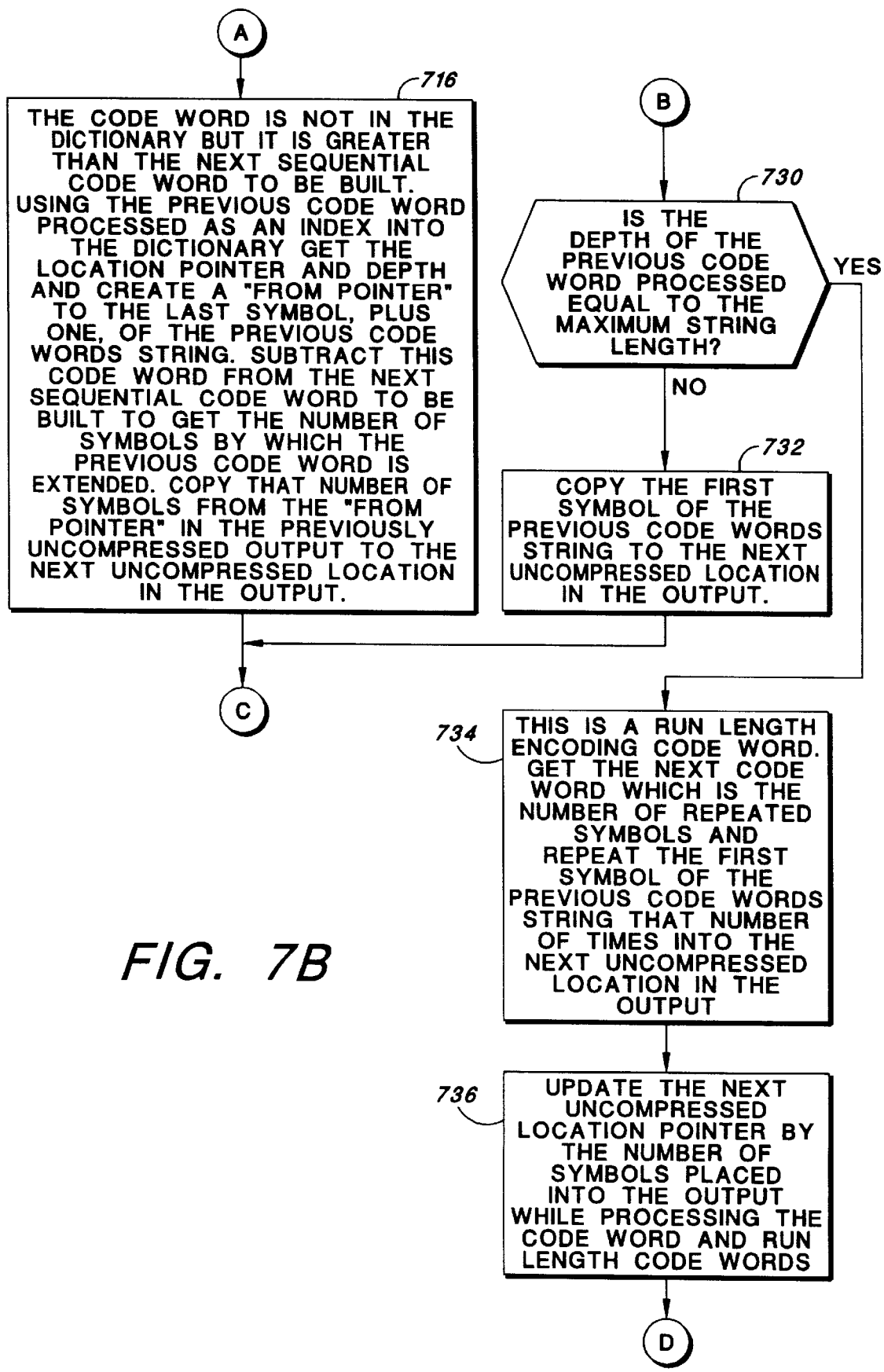
Figure 7C:
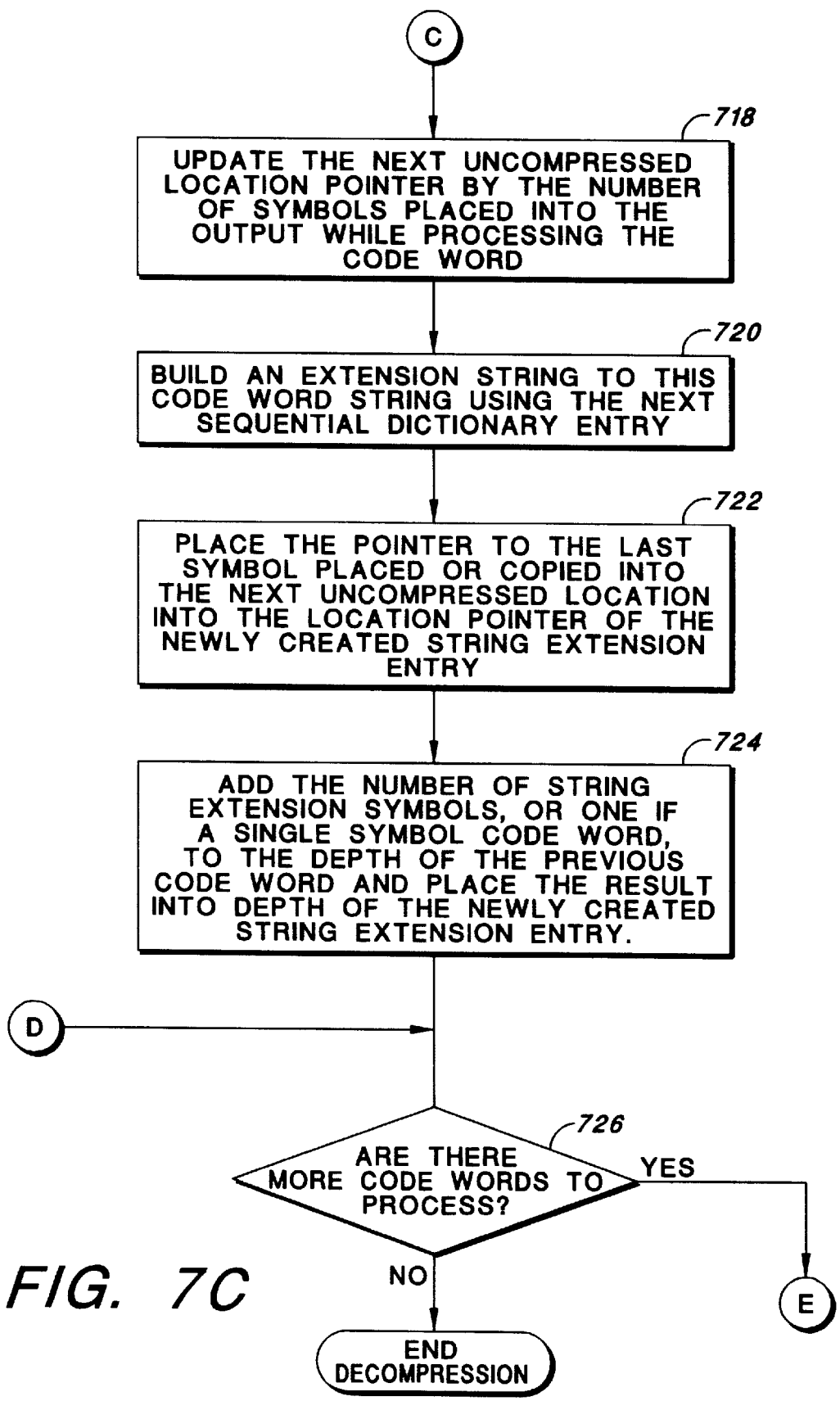

Referring to FIGS. 7A, 7B and 7C, a flowchart is shown of steps traversed by one variation of the decompressor. The decompressor starts (Block 700) with a first code word of the compressed data block, making a single pass, and processes the code words one at a time (Block 702), as follows:

1. The decompressor determines (Block 704) if the code word represents a single symbol (i.e., less than 100h) and if so, places the symbol directly into the uncompressed data, i.e., output data stream, at a next available location (Block 706). The decompressor maintains a pointer to the location within the output data stream at which the next uncompressed symbol, or string of symbols, generated by the decompressor is to be placed.
2. If the code word does not represent a single character (Block 704), but a string of symbols, the decompressor does one of the following depending upon the code word.
    1. If the code word is less than the next sequential code word to be built, i.e., its entry is in the decompression dictionary (Block 708), the decompressor uses the code word as an index into the decompression dictionary to find the LOCATION POINTER (200) and DEPTH (202) of the string defined by the code word (Block 710). The decompressor copies the string of symbols defined by the code word to the next location in the output data stream 16.
    2. If the code word is equal to the next sequential code word to be built, i.e., the dictionary entry that will be built extending the previous string (Blocks 708 and 712). The previous code word is used as an index into the decompression dictionary. The previous code word's LOCATION POINTER (200) and DEPTH (202) are used to copy its string to the next uncompressed location (Block 714) in the output data stream. Then, the first character of the previous code word's string is placed into the next uncompressed location.
    3. If the code word is greater than the next sequential code word to be built, i.e., an extended string signaling code word (Block 712), then the previous code word is used as an index into the dictionary (Block 716). The extended string signaling code word is subtracted from the last code word built to obtain the number of symbols to extend the previous string. The previous code word's LOCATION POINTER (200), pointing to the last symbol of its string, plus one, is the first of the extended symbols that are copied to the next location within the output data stream.
3. The decompressor then updates (Block 718) the next location in the uncompressed data pointer by the number of symbols placed into the output data stream during the processing of the code word.
4. The decompressor builds (Block 720) an extension string to the string represented by the previous code word by using the next sequential dictionary entry, following the last code word entry built, as follows:
    1. Sets (Block 722) the LOCATION POINTER (200) to the last character placed or copied into the uncompressed data. The symbol identified by the LOCATION POINTER (200) is the symbol preceding the next uncompressed location pointer 200, updated in step 3, above.
    2. Adds (Block 724) the number of string extension symbols, which is one, unless the extension string is an extended string (i.e., as signaled by an extended string signaling code word), to the DEPTH (202) of the previous code word and places the result into DEPTH (202).
5. Starts over again with the next code word (Block 726) in the compressed data stream to process.

In this way, the present data compression system compresses and decompresses data so as to make more optimal use of available processing, time, storage space and bandwidth resources.

EXAMPLE 1

Using, as an example data block, the string "COMPUTER", repeated 8 times in a data block with at least one intervening character between repetitions, the present approach builds 9 code words, extension strings, and dictionary entries when compressing or decompressing. For ease of understanding, intervening characters are not included in the example or figures. Dictionary entries 1 through 8, i.e., 100h through 107h are built the 1st time the string is encountered, but the 2nd time a string extension entry that extends dictionary entry 1 by 6 characters is built, i.e., 108h, whose code word represents all 8 characters, i.e., the first dictionary entry, which represents "CO" extended by six additional characters, "MPUTER". As a result, the compression ratio is improved by assigning a code word that represents a complete string the 2nd time it is encountered. This differs from the prior approach, for example, of U.S. Pat. No. 4,558,302 (Welch, et al.) in which a string is extended by only one symbol each time it is encountered. The present approach builds the code words, string extensions, and string table entries shown in FIGS. 2 and 3 while compressing the example data block and builds the code words shown in FIGS. 4 and 5 while decompressing the example data block.

In contrast to the earlier approach described in the '302 patent, the present approach generates the following compressed output in response to the first 8 occurrences of the word "COMPUTER" in the example data block:

| 1st Time | 2nd Time | 3rd Time | 4th Time | 5th Time | 6th Time | 7th Time | 8th Time |
|---|---|---|---|---|---|---|---|
| COMPUTER | 100h 10Dh | 108h | 108h | 108h | 108h | 108h | 108h |

Note that the 10Dh output on the 2nd occurrence indicates an extended string signaling code word. The last dictionary entry built at that point was code word 107h, thus a 10Dh extends the previous code word's string by 6 characters. At the same time an entry for code word 108h is built representing the 6 character extension string. An exemplary compression dictionary built in accordance with the present example is shown in FIG. 2. An exemplary input data stream and an exemplary compressed data stream in accordance with the present example are shown in FIGS. 3 and 5. An exemplary decompression dictionary built in accordance with the present example is shown in FIG. 4. Note that when the decompressor receives code word 100h, it copies the two symbols from location 0 to the next uncompressed location, which at that time is location 9. Further note that when it next receives the code word 10Dh, which is not in the dictionary and is not the next code word to be built, it determines an extension length of 6. The decompressor then uses the next location in the output data stream, past the end of the previous code word received, i.e., location 2, which is past the end of the dictionary entry for code word 100h, and copies six symbols from location 2h to the next uncompressed location which is now location Bh. It then creates a dictionary entry for the extended code word, code word 108h, by adding the extension length of 6 to the length of the previous code word received, i.e., 2, for a depth of 8, and places a pointer to the symbol copied into location 10h.

In this example, the present approach reduces the number of string extension table entries and code words built from 22 (in accordance with the approach taken in the '302 patent) to 9 (in accordance with the present approach). In addition, the present approach reduces the compressed output from 26 code words (in accordance with the approach taken in the '302 patent) to 16 code words (in accordance with the present approach). Thus, the present approach represents a substantial improvement over the prior art.

In accordance with particular features of a variation of the present embodiment, sequential repeating patterns are compressed very efficiently by the present embodiment. (Blocks 620, 644 of FIG. 6B) This is true for a single symbol sequential repeating pattern, such as a string of 30 "A" characters, or a multiple symbol sequential repeating pattern such as "ABCABCABCABCABCABC". After a first iteration of the repeating pattern is processed it can be extended to its maximum useful length with two additional code words using the extended string mechanism described herein. The sequential repeating patterns are processed in the normal way by extending the string. It is efficient because after the first iteration of the repeating pattern is processed the entire string can be extended. After the first A is processed, compare the character following the first A with those following the second A the next 29 characters are equal (i.e., the same) so the string is extended by 29. The compressor copies the 15 A to the second, second to third, third to fourth, etc. 29 times to recreate the string. ABCABCAB-CABCABCABC When the second occurrence of AB is compressed using its code word of 100h, the character following the dictionary entry (100h), which is the first C, is compared to the next character to compress, the second C, and all characters will be equal since it is an overlapping sequence, thus the string is extended by the length of the pattern minus five. The present embodiment can represent the above single character sequential repeating pattern (30 "A" characters) with three code words and the multiple character sequential repeating pattern ("ABCABCABCABCABCABC") with five code words. The decompressor 22 automatically handles sequential repeating patterns, without special accommodations.

An additional feature of the present approach requires that strings are allowed to be extended to a string length maximum of 30 characters, a maximum which is a configuration option and easily modified in accordance with particular design choices. To complement a string length maximum, whatever its value, a run length encoding method can be used in accordance with variations of the present embodiment to compress long strings of a single repeated symbol. (Blocks 644 and 646 of FIG. 6B) When the compressor finds a longest string that is also a string length maximum, it outputs its code word and determines how many additional repeated symbols there are before a different symbol is encountered. If there are more than the string length maximum of additional repeated symbols the compressor outputs a run length signaling code word equal to the next code word to be built. The run length signaling code word is followed by the number of additional repetitions of the symbol. Neither the compressor nor the decompressor actually build a string extension entry at the next code word when the present run length encoding method is employed, but merely "borrow" the next code to be built as the run length signaling code word. The decompressor 22 handles run length signally code words as illustrated in FIG. 7B, in Blocks 730, 734 and 736.

EXAMPLE II

By combining run length encoding with multiple symbol string extension, the present approach can represent a very long single symbol sequential repeating pattern with code words. For example, if a data block starts with 500 duplicated "A" symbols (a 41h in ASCII), the present approach generates a compressed output consisting of the code words 41h, 10h, 11ch, 102h, 1B6h. These code words represent 1, 2, 28, 31 and 438 "A"s respectively. In the process, the compressor builds only two code words and string extension dictionary entries, i.e., for 100h, which extends "A" by one additional character and for 101h, which extends 100h by 28 additional characters, 11CH is an extended string signaling code word (101h, which is the next available code word, plus 28 additional symbols), 102h (which is then the next available code word) is a run length signaling code word, 1B6h indicates the run length.

EMBODIMENT B

Referring back to FIG. 1, a block diagram is used to describe a preferred embodiment of the present invention. Several changes have been made to the previous embodiment, but the same block diagram will be referred to describe the changes. The block diagram includes the functional components of a data compression system 10 in combination with an input data stream 12, a data channel 14 and an output data stream 16, in accordance with one embodiment of the present invention. Shown is the input data stream 12, a compressor 18, a compression dictionary 20, the data channel 14 carrying compressed data, a decompressor 22, a decompression dictionary 24 and the output data stream 16. The compressor 18, the compression dictionary 20, the decompressor 22 and the decompression dictionary 24 together make up the data compression system 10. The compression dictionary 20 includes a code word dictionary and a root node dictionary (shown in FIGS. 8A and 8B). The input data stream 12 may be received as one block of symbols or it may be received one symbol at a time. Note that throughout the discussion symbols and characters are discussed synonymously. The following highlights the changes in the preferred embodiment.

Improvement 1

The first improvements to the compressor are minor and minimally improve compression, but simplify the algorithm. The Run Length Encoding mechanism has been removed, which was applicable to symbol or character strings greater than 30 symbols. In the preferred embodiment, the maximum string length is now 255 symbols. Secondly, STEPUP, EXTEND, and FLUSH control code words are reserved in the first three compression dictionary entries. These control code words are described with reference to FIG. 8A.

Improvement 2

Every time the compressor and decompressor create a code word defining a one symbol extension to a one symbol string (i.e. creates a 2 symbol string), a flag is set indicating that this is the first occurrence of the 2 symbol string. The next time the 2 symbol string is encountered, the flag indicates that this is the first time the 2 symbol (or character) string has been matched. Thus, the second time the 2 symbol string has occurred, it is also likely that this is the second time a string of 3 or more characters has been encountered in the input data stream. After the code word (defining a 2 symbol string) is placed into the compressed output, the symbols following the current 2 character string are compared with the symbols following the previous occurrence of the two character string (similar to the previous embodiment). Instead of automatically creating a multi-symbol extension string signaling code word, as Embodiment A does, the compressor performs the following steps. If none of the following symbols match, then a "1" bit (length field bit) is placed in the compressed output. If less than 11 characters in order match (i.e. the matched string is 3 to 14 characters in length), then a "0" bit (length field bit) is placed in the compressed output, immediately followed a length field defined as:

(1) if extended by 1 to 3 characters (i.e. a 3 to 5 character string), then output two bits indicating the number of extended characters minus one (i.e. output a "01" if extended 2 characters)

(2) If extended by 4 to 11 characters (i.e. a 6 to 13 character string) output two "1" bits followed by 3 bits indicating the number of extended characters minus 4 (i.e. output "11010" if extended 6 characters).

In the event the extension is greater than 11 characters, then the previous extension technique, from Embodiment A, is used where a multi-symbol extension string signaling code word is defined to tell the decompressor how far to extend the string. This approach is advantageous since it allows encoding of a 3 to 5 character string the second time it is encountered by outputting only 3 additional bits and a 6 to 13 characters string by outputting only 6 additional bits. The previous embodiment must output, at minimum, 9 bits. This procedure is also discussed with reference to FIGS. 12A through 12D and FIGS. 13A through 13C.

Improvement 3

Figures 8A, 8B, 9:
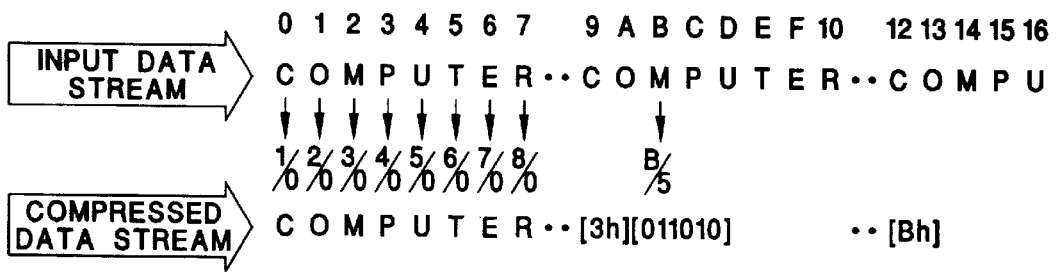
FIGS. 8A and 8B are tabular representations of a code word dictionary and a root node dictionary, respectively, generated by the data compression system in another embodiment of the present invention shown in FIG. 1.
FIG. 9 is a tabular representation of exemplary input (or original) data suitable for compression with the data compression system and which the code word dictionary and root node dictionary shown in FIGS. 8A and 8B have been generated.

The third improvement is the elimination of the first 256 entries of the compression dictionary which were reserved for the 256 possible combinations of a hexadecimal byte and the creation of a second dictionary called a root node dictionary. The compression dictionary 20 now contains a code word dictionary and a root node dictionary, as can be seen in FIGS. 8A and 8B below.

Unlike the previous embodiment, and in accordance with the preferred embodiment of the data compression system 10, the first, for example, 256 code words of, for example, 1024 possible assignable code words are not reserved for the 256 possible hexadecimal character code representations of an 8 bit byte character. Thus, in accordance with the preferred embodiment, all of the 1024 (instead of only 768 with the previous embodiment) possible assignable code words, are available for assignment as code word dictionary entries to recurring strings of bytes (i.e., redundancies) built as character patterns are encountered within data to be compressed, i.e., during compression of the input data stream 12, or code words are processed within already compressed data, i.e., during decompression of the compressed data stream 14. only the first three entries of the code word dictionary will be reserved as discussed below, so actually 1021 code words, compared to 768 with the previous embodiment, can be built and stored in the code word dictionary of the compression dictionary 20 during compression and built and stored in the decompression dictionary 24 during decompression.

With regards to the 256 possible hexadecimal combinations of an eight bit byte character, a separate dictionary called a "root node dictionary" is used to store them. The root node dictionary is described with reference to FIG. 8B. The root node dictionary has 256 entries each having an extension pointer.

Another difference in the preferred embodiment, is that an identifying bit is placed into the compressed output immediately before each single character or code word, represented by a set of bits, to be processed. The identifying bit tells the decompressor whether the following bits represent a single character (symbol) or a multiple character code word. Thus, a single character string (8 bit character) can be represented by 9 bits, regardless of the current code word size. If the first bit is a "0", the decompressor knows that the next 8 bit s are a single character string. If a "1" is the first bit, then the decompressor knows the next bits are a multiple character code word indicating a string of characters or a control code word. Since the first bit distinguishes the code words from the single characters, the first 256 entries of the code word dictionary do not need to be reserved, and can be used as code words. This feature is important when compressing individual frames of 1500 bytes or less, using a 1024 entry dictionary and a maximum code word of 10 bits or less.

Furthermore, since the first 256 entries are not reserved, the compressor can start building code words with as few as 6 bits, whereas the previous embodiment starts with 9 bit code words and "steps up" to a 10 bit code word after the $512^{th}$ entry. This represents an overall savings in bits placed into the output.

Improvement 4

This improvement can only be used with Improvement 3. For ASCII text frames, an ASCII character is represented by 7 bits since the high order $8^{th}$ bit is always zero. Thus, an ASCII character can be represented by 8 bit s total, (the $8^{th}$ bit is the identifying bit) not 9 bits total. The compressor initializes assuming ASCII data (see FIG. 12A). The compressor then starts compressing representing single ASCII characters with 8 bit s total including 1 bit for the identifying bit (which will be "0") and 7 bits for the ASCII character. This provides a 1 bit savings until a non-ASCII character is encountered in the input data stream (indicated by the $8^{th}$ bit being a "1"). Once this occurs, the compressor places the identifying bit "1" (indicating a code word) then a STEPUP control code word (Improvement 2, see FIG. 8A) into the compressed output followed by the identifying bit (indicating a single character) and an 8 bit character. From that point forward until the compressor is reinitialized, all single character strings will require 9 bits (even if an ASCII character). The decompressor then receives the "1" identifying bit and knows a code word is next, which is the STEPUP control code word. The decompressor then knows that all subsequent single character strings will be represented by 9 bits instead of 8 bit s.

This feature does not improve the compression ratio of non-ASCII data, but can improve the ratios of ASCII data depending on how well the data "compresses". If data compresses well, it only adds only a percent or so to the compression ratio, but if it compresses poorly, it can add several percent to the ratio.

This feature should only be performed upon the data portion of an IP or network frame. The header, which typically has random non-ASCII characters, should not be included in the data compression. The header is either passed through transparently or compressed using IP header compression methods.

Furthermore, as with the previous embodiment (Embodiment A), in the preferred embodiment (Embodiment B) the compressor stops building dictionary entries and extending strings when the 1024th code word is built, however, this is a matter of design choice and can be adapted to particular applications of the embodiment. Alternatively, the compressor may simply start over writing over the code words starting with 3h, if in stream mode, which is described below. With particular sizes of data streams, optimal performance may be achievable by, for example, employing 512, 2048, 4096 or more code words. The code words, however many, represent strings of bytes (or, more accurately, their assigned pointers to assigned character bytes or recurring strings of bytes) within the input data stream make up the compression dictionary 20. The compression dictionary 20 is used to translate data to be compressed (original data, i.e., the input data stream) into compressed data (i.e., the compressed data stream), and the decompression dictionary 24, which is used to translate the compressed data back into the original data (i.e., the output data stream).

Similar to the previous embodiment, in the preferred embodiment, the data compression system employs structure for the compression dictionary 20 that is different from the structure of the decompression dictionary 24.

Referring next to FIGS. 8A and 8B, the code word dictionary 800 and the root node dictionary 809, respectively, are shown in accordance with the preferred embodiment of the present invention. In the code word dictionary 800 are the reserved entries 801, the extension pointer 802, the parallel pointer 804, location pointer 806, and count 808. The root node dictionary contains only the root extension pointer 810.

RESERVED ENTRIES (801)—The reserved entries are the first three entries of the code word dictionary and are described above as "Improvement 1". The first entry (0h) is the a STEPUP control code word. The STEPUP control code word is inserted into the compressed output whenever a code word is output into the compressed output, wherein the code word crosses a code word boundary (i.e. where the length of the code word changes). For example, the current code word size is 6 bits and the compressor outputs a code word that is 7 bits long, the compressor will output the STEPUP control code word before the actual code word (with the appropriate identifying bits preceding the control code word and the code word). This signals to the decompressor that the code words will now have a length of 7 bits, not 6 bits as the previous code words did. Note that the STEPUP control code word is output only when a code word that crosses a boundary is output in the output data stream, not when a code word is created in the code word dictionary 800 that crosses a boundary. Boundaries occur at the $64^{th}$, $128^{th}$, $256^{th}$, and $512^{th}$ entries in a 1024 entry code word dictionary 800.

The second entry (1h) is the EXTEND control code word. The EXTEND control code word is always followed by a extension length field which is used to indicate that the previous code words string is being extended by multiple symbols. The EXTEND control code word is output in place of multi-symbol extension string signaling code word when the multi-symbol extension string signaling code word would cross a code word boundary and require more bits than the current code word size and is immediately followed by the extension length field.

The third entry (2h) is the FLUSH control code word. The FLUSH control code word indicates the end of the data stream to the decompressor.

EXTENSION POINTER (802)—A pointer to a code word dictionary entry that defines an "extension string" to a current string of characters or current data string. There are 1021 extension pointers each associated with a code word dictionary entry, and each code word dictionary entry is associated with a code word. Note that the first 256 entries are available for use as code words are described above with "Improvement 3". Thus, there are 1021 entries (3h–3ffh) available for code word in a 10 bit compression dictionary.

PARALLEL POINTER (804)—A pointer to a code word dictionary entry that defines an "extension string" to a previous string, a parallel string, i.e., a string that starts with the same character or characters as the current string and, thus, has the same previous string entry as the current string. There are 1021 parallel pointers, associated with code words 3 through 1023.

LOCATION POINTER (806)—A pointer, into a previously compressed area of the input data stream, to a location of a first character of one or more extension characters of an extension string defined by a code word dictionary entry. There are 1021 such pointers, for code words 3 through 1023.

COUNT (808)—A number of symbols, in addition to the symbol pointed to by the location pointer, defined by a code word dictionary entry. Alternatively, the count 808 could include the symbol pointed to by the location pointer 806. There are 1021 such counts, for code words 3 through 1023.

Referring to FIG. 8B, the root node dictionary 809 is shown and is defined as having a root extension pointer 810:

ROOT EXTENSION POINTER (810)—This is a pointer to an entry in the code word dictionary 800 that defines an "extension string" to a single character represented in the root node dictionary 809. The extension string is defined in the code word dictionary. There are 256 extension pointers each associated with one of the 256 possible combinations of a hexadecimal byte, and each pointing to code word dictionary entry associated with a multiple character string. The root node dictionary 809 comprises the removed first 256 entries from compression dictionary of the previous embodiment and is described above with "Improvement 3".

The compressor 18 only has to initialize the root node dictionary 809 by placing an illegal pointer value into the every RROT EXTENSION POINTER (810) of the root node dictionary 809. No other initialization is required with the code word dictionary 800.

Referring next to FIG. 9, an illustration is shown of an exemplary input data stream in response to which the code word dictionary 800 and root node dictionary 809 in FIGS. 8A and 8B are generated. This example is further described with reference to EXAMPLE III below.

Figures 10, 11:
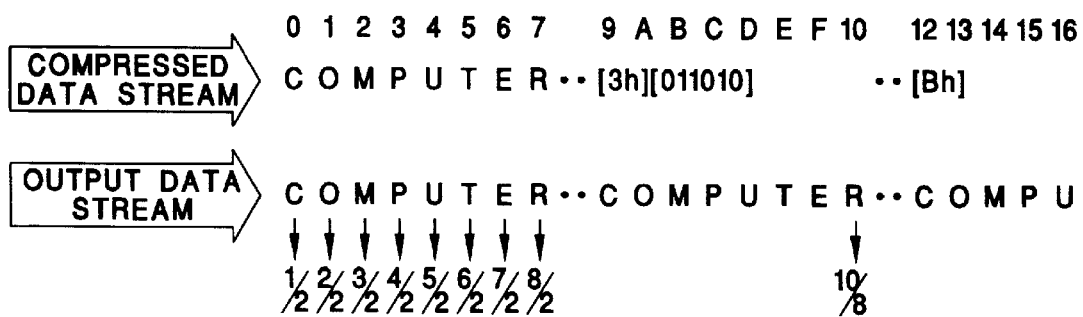
FIG. 10 is a tabular representation of a decompression dictionary generated by the data compression system of FIG. 1 using the embodiment shown in FIGS. 8A through 9.
FIG. 11 is a tabular representation of exemplary compressed data generated by the data compression system of another embodiment of FIG. 1 in response to the input data of FIG. 9.

Referring next to FIG. 10, the decompression dictionary 24 is shown. The decompression dictionary 24 structure is different than that of the code word dictionary and the root node dictionary. It remains unchanged from the previous embodiment, except for the reserved entries 1000 and is defined according to the following elements illustrated in FIG. 10:

RESERVED ENTRIES (1000)—The first three entries of the decompression dictionary 24 are reserved for the corresponding control code words of the code word dictionary: STEPUP, EXTEND, and FLUSH.

LOCATION POINTER (1002)—A pointer, into a previously decompressed area of the output data stream that points to a last character of a string of characters defined by a code word and a decompression dictionary entry. There are 1021 such pointers, for code words 3 through 1023. In contrast, the previous embodiment only has 768 pointers.

DEPTH (1004)—A word that contains a number of characters in a string, the last of which characters is at the location in the previously decompressed area of the output data stream pointed to by the location pointer, defined by a code word and a dictionary entry. The decompressor subtracts the depth minus one from the location pointer to determine the first character of the string defined by the code word being processed. There are 1021 such words, for code words 3 through 1023.

The decompression dictionary 24 requires no initialization. The only change structurally to the previous embodiment is the additional 256 entries.

Code words are assigned in increasing sequential numerical order starting with 3, or 3 hexadecimal (h), and ending with 1023, or 3FFh. Code words 0, or 0h, through 2 or 2h, are reserved for control purposes. Thus, the first entry built into the decompression dictionary is the fourth entry or 3h.

Referring to FIG. 11, an illustration is shown of an exemplary compressed data stream generated by the compressor 18 in response to the input data stream of FIG. 10. This is further illustrated in EXAMPLE III below.

Figure 12A:
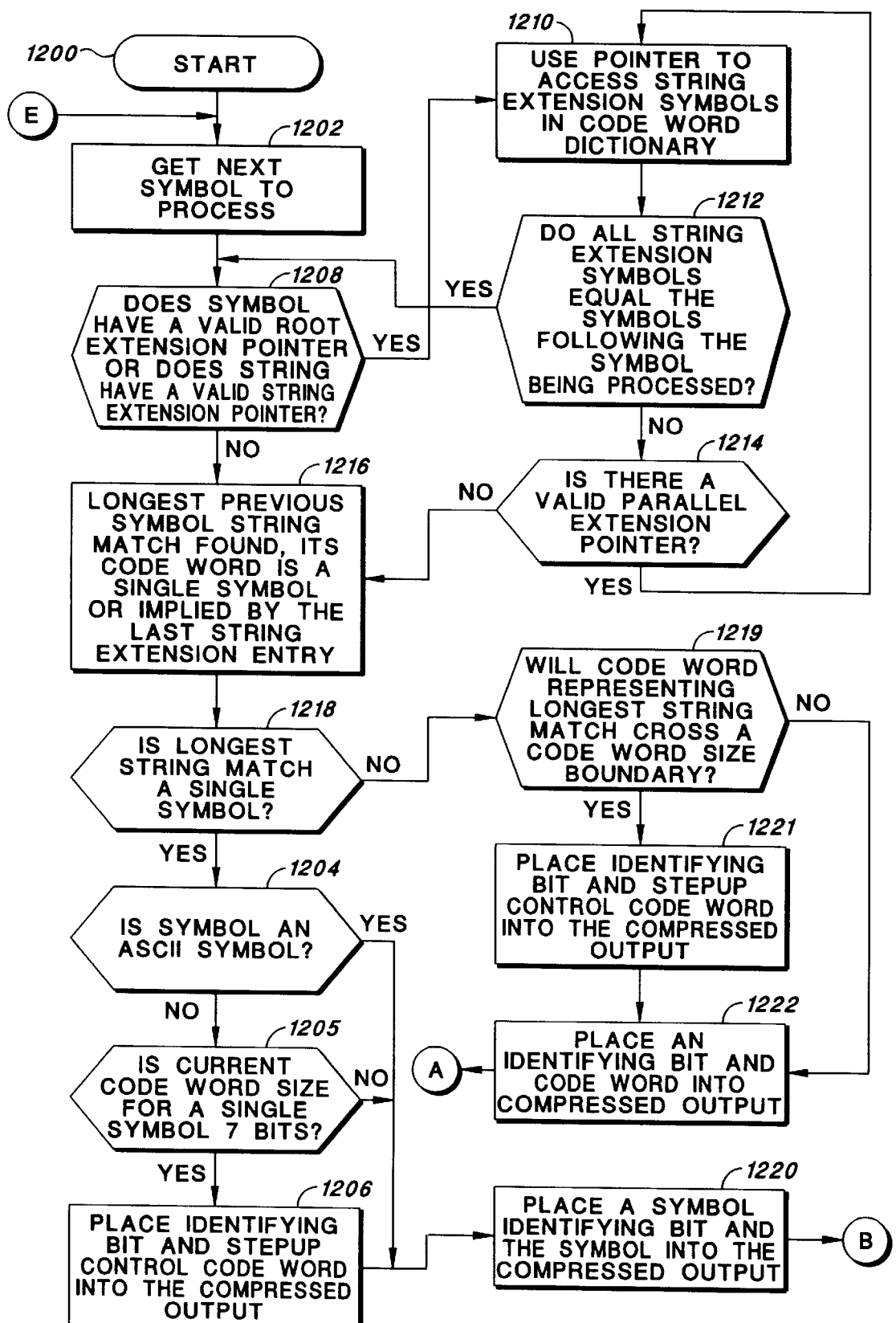
FIGS. 12A, 12B and 12C are flow charts illustrating steps traversed by the data compression system of another embodiment of FIG. 1 shown in FIGS. 8A through 9 in order to compress an input data stream.
Figure 12B:
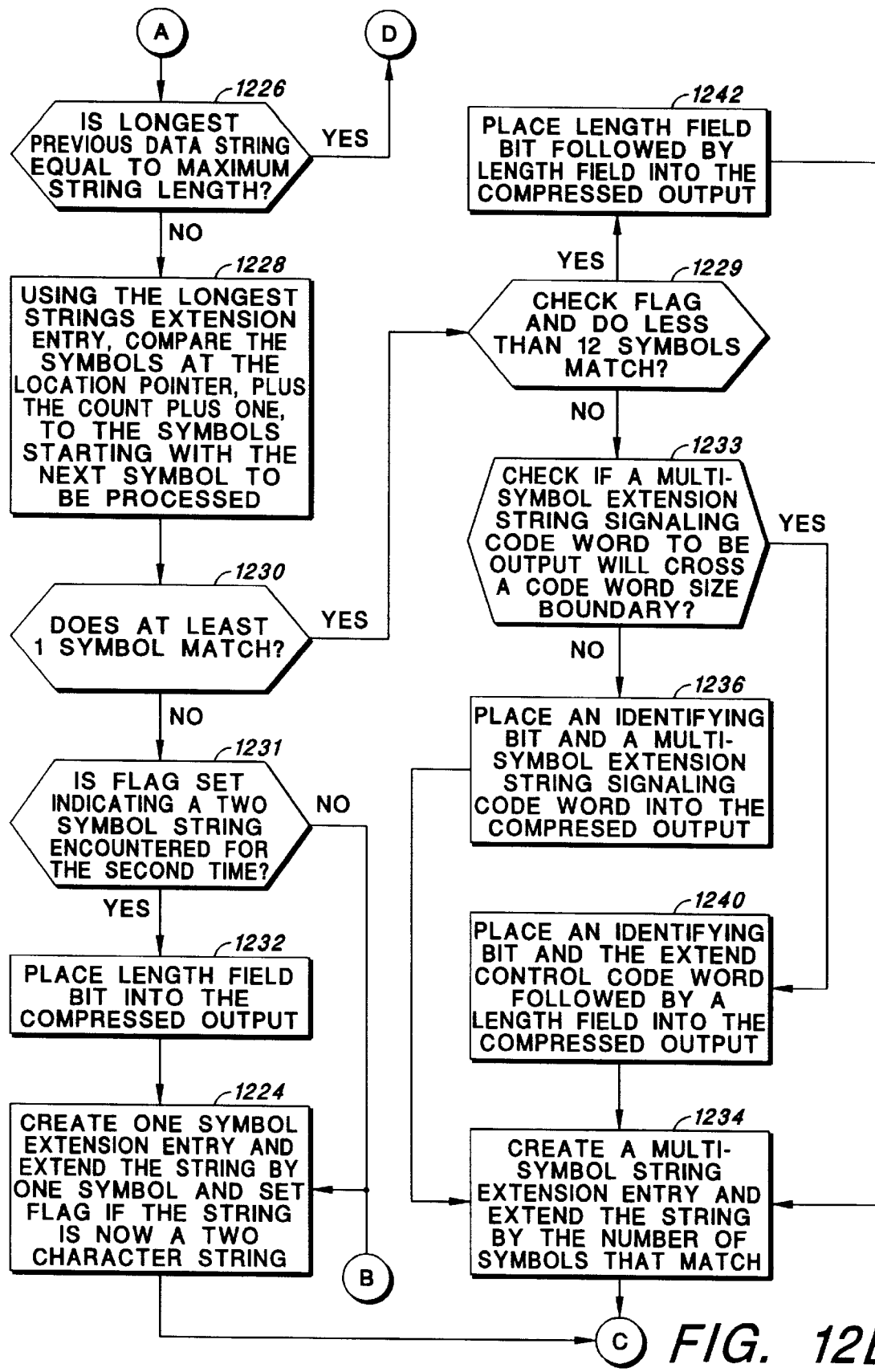
Figure 12C:
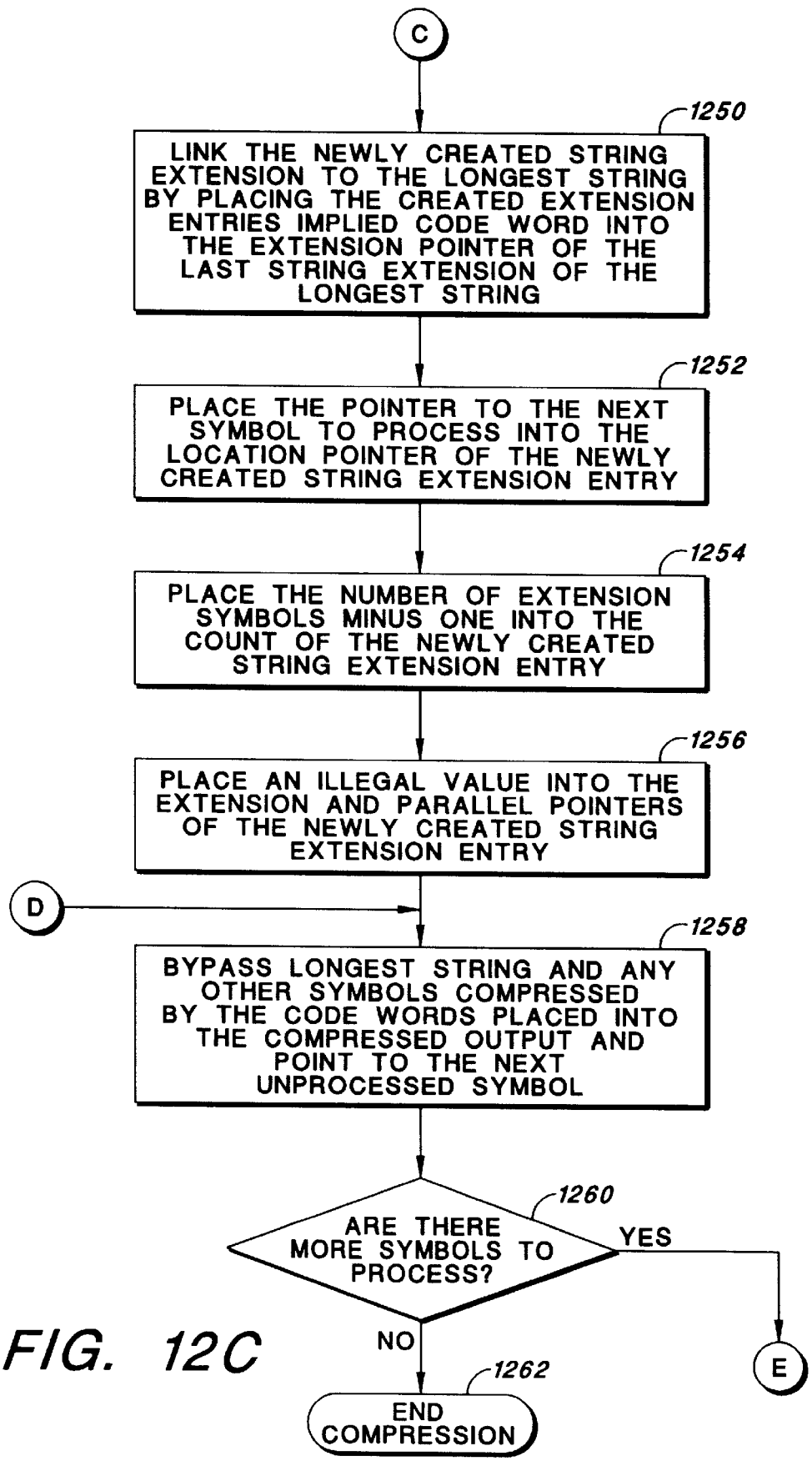
Figure 13A:
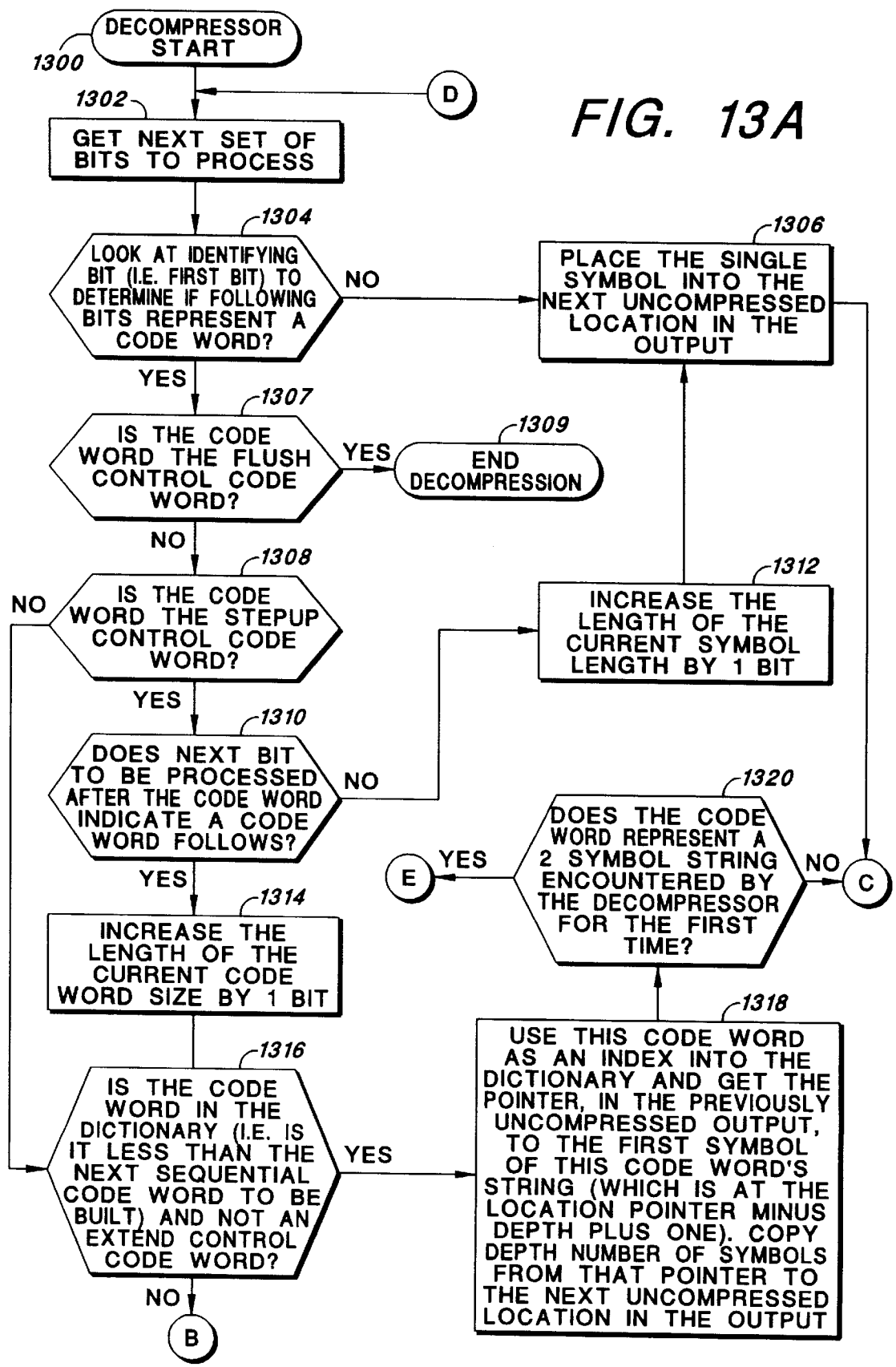
FIGS. 13A, 13B and 13C are flow charts illustrating steps traversed by the data compression system of another embodiment of FIG. 1 shown in FIGS. 8A through 12D in order to decompress a compressed data stream.
Figure 13B:
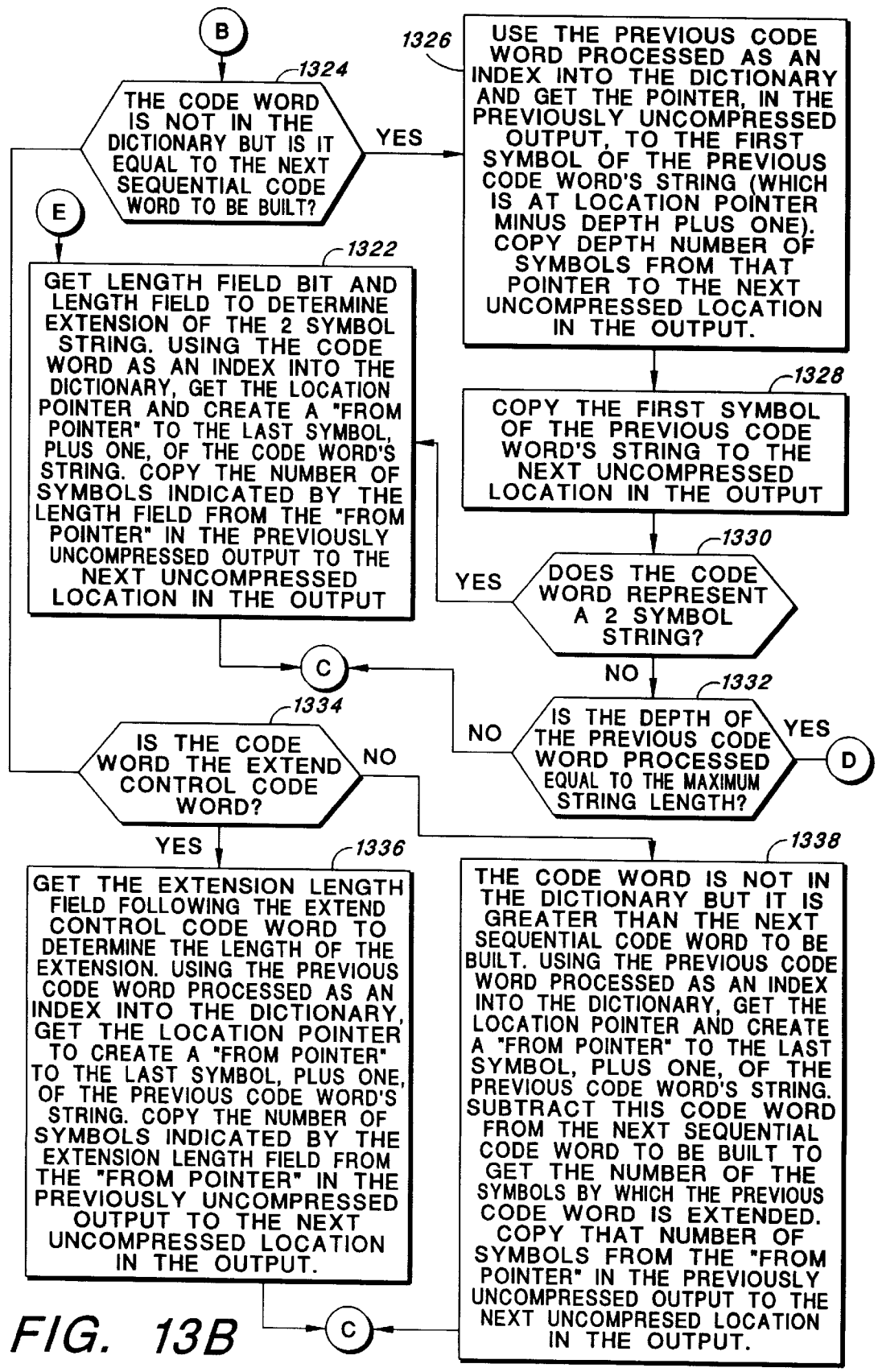
Figure 13C:
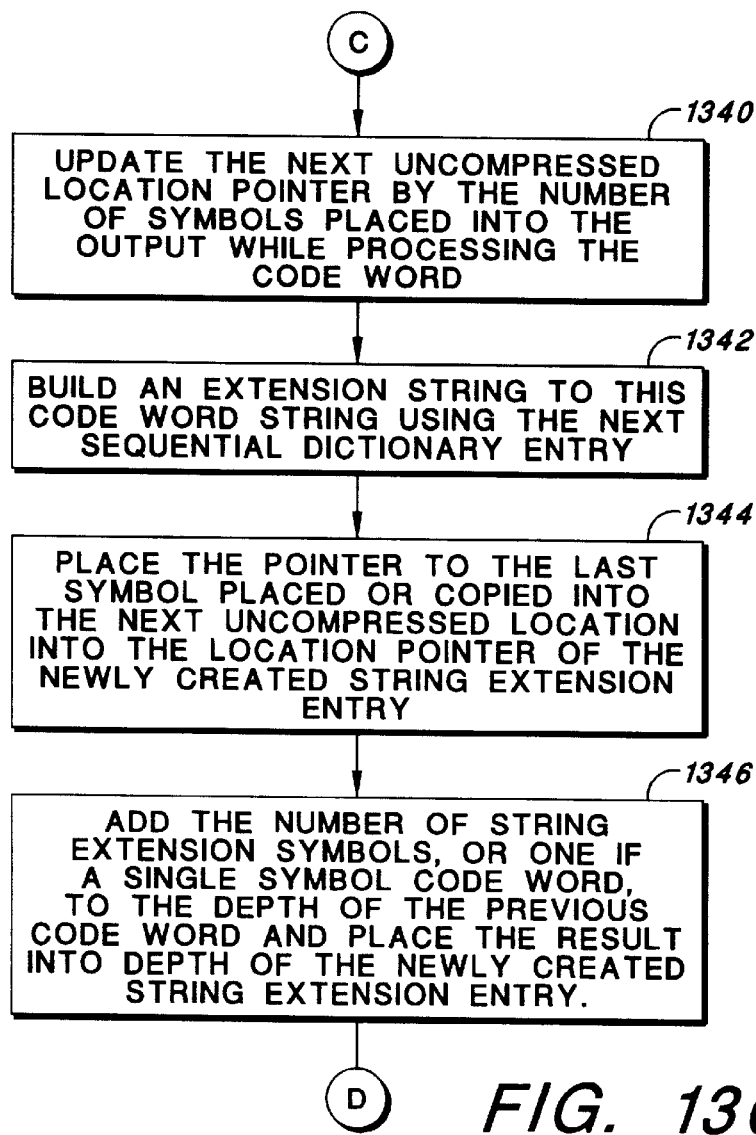

Referring to FIGS. 12A, 12B, and 12C a flowchart is shown of steps traversed in the preferred embodiment of the compressor during a compression operation. The compressor starts (Block 1200) with a first symbol or character in the input data stream (which may be a block of symbols or one symbol at a time), making a single pass through the input data stream, processing one or more symbols at a time (Block 1202), and building the code word dictionary and root node dictionary with the individual symbols and repeated strings of symbols it encounters, as follows:

1. Initially, the compressor 18 finds a longest previous data string which is a previously encountered string of symbols that matches a current string of symbols that starts with a symbol currently being processed as follows:

A. The compressor 18 determines (Block 1208) if the symbol being processed has been encountered previously in the data stream, by checking the ROOT EXTENSION POINTER (810) (or string extension entry) and using the hexadecimal value of the symbol as an index in the root node dictionary to see if there is a valid root extension pointer 810. If there is a valid root extension pointer 810, the symbol has been previously encountered, and thus the root extension pointer 810 points to a multiple symbol string in the code word dictionary 800.

B. If the root extension pointer 810 has an illegal value (Block 1208), the symbol has not been encountered previously and the longest existing string match is found, a single symbol (Block 1216).

C. If the root extension pointer 810 has a legal value (Block 1208), the symbol has been encountered previously and points to a string extension entry or extension pointer 802 within the code word dictionary 800 that defines additional string symbols for comparison.

D. Using the root extension pointer 810 to access the string extension's code word dictionary entry (Block 1210), the compressor determines (Block 1212) if the symbols defined by the string extension's dictionary entry are equal to the symbols following the symbol being processed by using the code word dictionary's location pointer 806 and count 808. The first symbol defined by the string extension's code word dictionary entry is pointed to in the input data stream by the code word dictionary entry's location pointer 806, and the number of symbols in the code word dictionary entry is the code word dictionary entry's count 808 plus one.

E. If all symbols defined by the string extension's code word dictionary entry are equal to the symbols following the symbol being processed (Block 1212), processing continues back to Block 1208. All such equal symbols are bypassed to get to a next symbol to be processed.

F. If all the symbols defined by the location pointer 806 and count 808 of the code word dictionary entry are equal to the symbols following the symbol being processed (Block 1212), and the extension pointer (802) of the string extension's code word dictionary entry is an illegal value (Block 1208), the longest previous string match (or longest previous data string) has been found (Block 1216), which is a two symbol string in this case. The longest previous string match is a string of symbols that is represented by the code word assigned to the code word dictionary entry defining the entry for which all symbols represented match the symbols following the symbol being processed in the input data stream.

G. If not all the symbols defined by the 10 string extension's code word dictionary entry are equal to the symbols following the symbol being processed (Block 1212), the code word dictionary entry's parallel pointer (804) is checked (Block 1214) to determine if there is another code word dictionary entry that starts with the same symbols (Block 1210 and 1212), and thus has the same string extension.

H. If the parallel pointer (804) is an illegal value (Block 1214), the longest previous string match has been found (Block 1216), which is represented by the previous string extension's code word. If the previous string extension is the symbol being processed, the longest previous string match found is a single symbol (see step 1B).

I. If the parallel pointer (804) is a legal value (Block 1214), the compressor uses it to access (Block 1210) the parallel string's code word dictionary entry. The compressor determines if the symbols defined by the parallel string's location pointer and count are equal to the symbols following the symbol being processed (Block 1212). The steps starting at step 1E, above, are then repeated.

2. Next, the compressor then places either a single symbol into the compressed output or a code word representing a multiple symbol string as follows:

A. The compressor determines if the longest previous data string found was a single symbol or a multiple symbol string (block 1218).

B. If the longest string match is a single symbol (Block 1218), the compressor checks the symbol to determine if it is an ASCII character (block 1204). If the symbol is an ASCII character, then go directly to Block 1220, shown in step 2D below.

C. If the single symbol is not an ASCII symbol (block 1204), then the code word size for a single symbol is checked to see if it is 7 bits or 8 bit s. If the current code word size for a single symbol is 7 bits (Block 1205), then an identifying bit (indicating a code word) and the STEPUP control code word are output into the compressed data stream (block 1206) prior to the step in Block 1220. The STEPUP control code word indicates to the decompressor that from that point on, single character strings will be represented by 9 total bits (1 identifying bit+8 bits for the single symbol), even if they are ASCII characters. If the current code word size is not 7 bits (Block 1205), then the current code word size for a single symbol is already 8 bits, and single symbol strings are already being represented by 9 bits total.

D. The compressor then places an identifying bit of "O" (indicating a single symbol) into the output followed by the 7 or 8 bit single symbol (depending on Blocks 1204, 1205 and 1206) into the compressed data stream (block 1220). The leading identifying bit tells the decompressor that the following bits represent a single symbol. Once a non-ASCII symbol is output for the first time, the current code word size for all subsequent single symbols will be output as 8 bit symbols with an identifying bit, even if the single symbol is an ASCII character.

E. If the longest match is a multiple symbol string, then the compressor checks to see if the code word to be output will cross a code word size boundary (Block 1219).

F. If the code word that represents the longest string match crosses a code word size boundary or increases the length of the current code word size (Block 1219), then an identifying bit (indicating a code word) and the STEPUP control code word are placed into the compressed data stream (Block 1221). Then the step in Block 1222 is performed.

G. If the code word to be output does not cross a code word size boundary (Block 1219) or the code has crossed a code word size boundary as shown in Block 1221, an identifying bit of "1" (indicating a code word) followed by the code word (from the code word dictionary) representing the multiple symbol (or character) string is placed into the compressed data stream (block 1222). The leading "1" bit tells the decompressor that the following bits defined by the current code word size represents a multiple symbol string, which is the longest previous string match. The code words are shifted and packed into the compressed data stream as the longest previous string matches are determined.

3. Next, the compressor then extends the longest previous string match (or longest previous data string) by as many symbols as possible as follows:

A. If the longest previous string match is a single symbol (Block 1218), that string is extended by one symbol (Block 1224) by linking the next symbol to process as a one symbol string extension to the longest previous string match, i.e., the single symbol. Thus, a 2 symbol string is created within the code word dictionary. The code word dictionary entry used to represent the 2 symbol string is the next sequential unbuilt code word in the code word dictionary. At the same time, a flag is set (Block 1224) for the code word dictionary entry since this is the first occurrence of a two symbol string. The flag is for use in blocks 1229 and 1231, described below.

B. If the longest previous string match is a multiple symbol string (Block 1218), and is not already at a maximum string length (Block 1226), which is now 255 symbols, the compressor attempts to extend that longest previous string match by as many symbols as possible (Block 1228) by comparing the symbols following the longest previous string match with the next input symbols to be processed (i.e. the symbols following the current data string). Using the location pointer (806) of the last string extension entry of the longest previous string match (the code word dictionary entry defined by the code word for the longest previous string match placed into the compressed data stream) the compressor compares and determines how many symbols following the last symbol of the longest previous string match are equal to the next symbols of the current data string in the input data block stream. Thus, the compressor compares (Block 1228) the symbols pointed to by adding the location pointer (806) to the count (808) plus one, for the code word dictionary entry of the code word placed into the compressed data stream, to symbols starting with a next symbol in the input data stream to be processed. The symbols are compared in order until the compressor rinds a symbol that does not match.

C. If at least one symbol matches (Block 1230), i.e. at least the first symbol following the last symbol of the previous longest string, then the flag is checked to see if the longest previous string match is a two symbol string that is being encountered for the second time and if the number of matching symbols is less than 12 (Block 1229). The flag was set in Block 1224, described in 3A above.

D. If the flag is not set or if the flag is set and there are greater than 12 matching symbols (Block 1229), the compressor checks to see if a multi-symbol extension string signaling code word to be output will cross a code word size boundary (Block 1233). The multi-symbol extension string signaling code word indicates the number of symbols by which the longest previous string match is to be extended. The multi-symbol extension string signaling code word is greater than the last code word, last code word dictionary entry, built by an increment that equals the number of symbols by which the longest previous string match is to be extended. For example, if the last code word built is Ah and the string is to be extended 6 symbols, then the multi-symbol extension string signaling code word will be 10h, i.e. Ah+6=10h. For example, if the last code word built was 3Ch (entry 60), and the string is to be extended 6 symbols, then the multi-symbol extension string signaling code word to be output would be 3C+6=42h (the 66th entry). Thus, the multi-symbol extension string signaling code word 42h would cross the boundary of 3Fh (the 64th entry).

E. If the multi-symbol extension string signaling code word to be output would not cross a code word size boundary (Block 1233), the compressor then places an identifying bit (indicating a code word) and the multi-symbol extension string signaling code word into the compressed data stream (Block 1236). Then the compressor creates the multi-symbol string extension entry and extends the longest string match by as many symbols as match (block 1234).

F. If the multi-symbol extension string signaling code word would cross a code word size boundary (Block 1233), then an identifying bit (indicating a code word) and the EXTEND control code word followed by an extension length field are placed into the compressed data stream (Block 1240). The EXTEND control code word tells the decompressor that a multi-symbol extension string signaling code word that would normally be placed into the compressed output has one more bit than the current code word size, and thus, will not be used. For example, if the last code word used is 3Ch (60) and the string is extended 10 symbols, the multi-symbol extension string signaling code word would be 45h (70) and crosses the boundary for code words using 6 bits to 7 bits. Thus, the code word identifying bit, the EXTEND code word, and an extension length field are placed in the compressed output, i.e. "1 EXTEND 10".

Then a multi-symbol string extension entry is created as shown in Block 1234.

G. If the flag indicated that this was the second occurrence of a two symbol string and the number of matching symbols are less than 12 (Block 1229), then a length field bit and length field are placed into the compressed output (Block 1242) according to "improvement 2" as follows. The length field bit is a "0" bit. This indicates to the decompressor that a length field follows as described below 1. If the two symbol string is being extended by 1 to 3 symbols (1 to 3 symbols match in Block 1230), the compressor places 2 bits in the compressed output that indicate the number of symbols extended minus 1. For example, if the string were extended 3 symbols, the compressor would place a length field of "10" in the compressed output to indicate that the longest previous data string is extended by 3 symbols (3−1=2 which is "10"). Note that during this procedure the decompressor does not expect to see an identifying bit, only the length field.

2. If the two symbol string is being extended from 4 to 11 symbols (i.e. 4 to 11 symbols match in Block 1230), the compressor places two "1" bits, followed by three bits to indicate the number of extended symbols minus 4. For example, if extending 6 symbols, the compressor will place a length field of "111010" in the. compressed output. The "11" indicates an extension of 4 to 11 symbols, and the "010" indicates an extension of 6 (6− 4=2 which is "010"). Thus, advantageously, the compressor outputs fewer bits for extending a 2 symbol string by 1 to 11 symbols (i.e. a 3–13 symbol string) the second time it occurs.

Next, a multi-symbol string extension entry is created and the string is extended by the number of symbols that match as shown in Block 1234.

H. If no symbols match (Block 1230), i.e. the first symbol following the last symbol of the previous longest string does not match the first symbol following the current data string, the compressor checks to see if the flag for the longest previous string has been previously set, indicating that the longest previous string is a two symbol string and that this is the second time it is being encountered (Block 1231).

I. If the flag has been set, then this indicates that the longest previous string is a two symbol string that can not be extended; thus, no symbols following the current symbol string (2 symbol string) match the symbols following the longest previous symbol string (2 symbol string). Therefore, in accordance with "improvement 2", a length field bit of "1" (indicating that no length field follows) is placed into the compressed output (Block 1232), then go to the next step in Block 1224.

J. If the flag is not set; thus, the longest previous string is not a two symbol string, then a code word dictionary entry is created representing the longest previous string extended by one symbol by linking (Block 1224) the next symbol to process as a one symbol extension to the longest previous string. Note the flag is not set again for the created code word dictionary entry since it represents a symbol string longer than two symbols, in this case.

4. Next, the compressor builds a string extension to the longest previous data string by using the next sequential unbuilt dictionary entry; thus creating a new longest data string (or newly created string extension), i.e., next unbuilt code word entry, as follows:

A. Linking the string extension to the longest previous data string (Block 1250) by placing a code word implied by a relative position of a new string extension entry into the EXTENSION pointer (802) of the last string extension of the longest previous data string. In other words, the extension pointer of the code word dictionary entry representing longest previous data string now points to the next sequential unbuilt code word dictionary entry (which will represent the longest previous data string having been extended).

For example, in the case that the longest previous data string is a one symbol string being extended by a one symbol (the path shown in blocks 1220 and 1224), the extension pointer 810 of the root node dictionary entry (representing the single symbol) now points to the next sequential unbuilt code word dictionary entry (code word) in the code word dictionary. In the case that the longest previous data string is a multiple symbol string being extended by one or more symbols (the paths shown in blocks 1222, 1226, 1229, 1230, and 1229, etc.), the extension pointer 802 of the code word dictionary entry (which represents the longest previous data string) now points to the next sequential unbuilt code word dictionary entry (code word) in the code word dictionary. In either case the next sequential code word will represent the longest previous data string having been extended or the newly created string extension (new longest data string).

B. Placing a pointer to a next symbol to process in the input data stream into the LOCATION pointer (806) of the newly created string extension (block 1252).

This points to a first symbol of the string extension, or the location of the first symbol that the longest previous data string is being extended with.

C. Placing the number of extension symbols minus one into the COUNT (106) of the newly created string extension entry (block 1254). This is the number of symbols minus one that the longest previous data string is being extended. The factor of minus one is implementation dependent and could simply be the number of extension symbols.

D. Placing an illegal pointer value into the EXTENSION POINTER (802) and the PARALLEL POINTER (804) of the newly created string extension entry (Block 1256). An illegal value is placed since an extension to the newly extended string has not been created yet.

5. If the longest previous data string was extended by multiple symbols, bypass (Block 1258) those multiple symbols (i.e., the longest previous data string and any other symbols compressed) to get to the next symbol (beyond those extended) to process.

6. Start over again (Block 1260) with the next symbol to process, if there is such a symbol, trying to find the longest previous data string or, if there are no more symbols to process, terminating the compressor (Block 1262).

The mechanism described above to extend the longest previous string found is applicable for extending strings by many symbols, not just one symbol at a time, and thus, is an improvement over the prior art.

The use of the multi-symbol extension string signaling code word is used exactly as described above with, FIGS. 6A, 6B, and 6C of Embodiment A, except that it is not used when extending a 2 symbol string by 11 or fewer symbols (or characters) the second time the 2 symbol string appears in the input data stream. Additionally, the multi-symbol extension string signaling code word is not used in conjunction with the EXTEND control code word. Each code word skipped by a multi-symbol extension string signaling code word indicates an additional symbol by which the previous string of symbols is extended. The multi-symbol extension string signaling code word can represent as many symbols as there are code words yet to be built. For example, if the last code word built is 205h, a string can be extended by 20 (decimal) characters by sending a multi-symbol extension string signaling code word of 219h (20 decimal is 14h and 205h plus 14h is 219h). The multi-symbol extension signaling code word is a signaling code word, is just that, a signal, the code word dictionary entry for the multi-symbol extension string signaling code word, at the time the signaling code word is used, and is not actually built yet by either the compressor or the decompressor. The next unused dictionary entry, following the last used dictionary entry, is used to build the multiple symbol string extension of the previous code word's string, the string extension implied by the multi-symbol extension string signaling code word. Once built, this code word dictionary entry is used in lieu of the extended string signaling code word, thus making usage of any given multi-symbol extension string signaling code word for a given string of symbols a one-time occurrence.

Additionally, for each set of bits placed in the compressed output, an identifying bit is first placed to indicate to the decompressor that the bits represent a single character (symbol) or a code word. The code word may be a multi-symbol code word or a control code word. One instance where this rule is not followed is in the event the compressor has encountered a 2 symbol string for the second time. The compressor sees the flag is set (from the first occurrence) and then checks to see if the string is extendable. If extendable, a length field bit and a length field are used, and if not extendable, the just a length field bit is used according to "Improvement 2".

Furthermore, whenever crossing a boundary in code word size (e.g. from 7 to 8 bit s), the compressor first outputs a STEPUP code word to tell the decompressor the size of the code word is changing.

Additionally, the compression algorithm has two modes: frame mode or stream mode. Frame mode is where the compressor compresses a frame of data at one time, such as compressing a 1500 byte frame. Every frame the compression dictionary is reinitialized for a new frame of data. In the stream mode, the compressor compresses a continuous stream of data that is not limited to a specific frame size. When the compressor fills up the code word dictionary 800, the compressor sends out a STEPUP control code word, and then reinitializes the root node dictionary and the code word dictionary. This depends on the length of the code word dictionary, but in a 1024 length code word dictionary, the compressor sends out a STEPUP control code word after the $1024^{th}$ entry has been built. Then, the compressor starts building dictionary entries over at 3h. Only Embodiment B has a stream mode.

The decompressor builds its dictionary using the characters and code words output by the compressor after they are received over the data channel 14. In accordance with the present embodiment, the dictionary entries and code words must reflect the same information that the compressor 18 used when building the code word dictionary and the root node dictionary and they both should keep pace with one another.

A major difference between the compression dictionary 20 built by the compressor 18 and the decompression dictionary 24 built by the decompressor 22 is that the entries in the compression dictionary 20 are built by the compressor 18 for an extension string when the compressor 18 finds and processes the current longest string. However, the decompressor 22 must wait until it gets the next code word to extend the symbol string represented by the current code word.

The decompression dictionary 24 only contains string extension code words from 3h through 3FFh. The decompression code words are implied from the relative position of their corresponding dictionary entries within the decompression dictionary 24.

Referring to FIG'S. 13A, 13B and 13C, a flowchart is shown of steps traversed by one variation of the decompressor. The decompressor starts (Block 1300) with a first set of bits, such that each set of bits represents a single symbol or a code word of the compressed data block, making a single pass, and processes the sets of bits one at a time (Block 1302), as follows:

1. The decompressor looks at the first bit, the identifying bit, to determine (Block 1304) if the following bits will represent a single symbol or a code word. If it is a single symbol (the identifying bit is a "0"), the decompressor places the symbol directly into the uncompressed data, i.e., output data stream, at a next available location (Block 1306). If the identifying bit is a "0", then the following 7 (or 8) bits represent a single symbol. The decompressor maintains a pointer to the location within the output data stream at which the next uncompressed symbol, or string of symbols, generated by the. decompressor is to be placed.

2. If the set of bits does not represent a single symbol (Block 1304), but a code word (the identifying bit is a "1"), the decompressor does one of the following depending upon the code word received:

A. If the code word is the FLUSH control code word (Block 1307), then the decompression is done (Block 1309). The FLUSH control code word signifies to the decompressor that there are no more symbols following to be compressed; thus, the end of the compressed data stream.

B. If the code word is the STEPUP control code word (Block 1308), then the decompressor determines if the next symbol to processed, which is the next identifying bit, indicates whether a code word or a single symbol follows (Block 1310).

1. If the next identifying bit indicates a single symbol (Block 1310), then the STEPUP code word indicates the size of the single symbol is increasing from 7 to 8 to account for the receipt of a first non-ASCII symbol in accordance with "improvement 4". Thus, the current single symbol length is increased (Block 1312) and the next single symbol is placed directly into the uncompressed output data (Block 1306). All subsequent single symbols will be represented by an identifying bit and 8 bit s (even if the symbol is an ASCII character).

2. If the next identifying bit indicates a code word (Block 1310), then the decompressor increases the length of the current code word size by one bit and retrieves the next code word to be processed (Block 1314). Thus, the decompressor knows to expect subsequent code words that are one bit longer than the previously received code words.

C. If the code word is less than the next sequential code word to be built, i.e., its entry is in the decompression dictionary and is not an EXTEND control code word (Block 1316), the decompressor uses the code word as an index into the decompression dictionary to find the LOCATION POINTER (1002) and DEPTH (1004) of the string defined by the code word (Block 1310). The location pointer minus the depth plus one, points to the first symbol of this code words string. The decompressor copies the depth number of symbols defined by the code word to the next location in the output data stream 16 (Block 1318).

1. Then the decompressor checks to see if the code word represents a 2 symbol string encountered by the decompressor for the first time (Block 1320). If not, then go to the step in Block 1340. If the code word does represent a 2 symbol string encountered for the first time, then the decompressor follows "improvement 2" as follows:

The length field bit and length field are obtained and then the code word is used as an index into the dictionary (Block 1322). The length field is used obtain the number of symbols (see "improvement 2") to extend the previous string. The code word's LOCATION POINTER (1002), pointing to the last symbol of its string, plus one, is the first (of the number determined from the length field) of the extended symbols that are copied to the next location within the output data stream (Block 1322).

For example, if the length field bit is a "1", then the two symbol string can not be extended (no length field) and only the two symbol string is output in to the output data stream. If the length field bit is a "0", then the two symbol string is extended by one or more symbols indicated by the length field.

D. If the code word is equal to the next sequential code word to be built, i.e., the dictionary entry that will be built extending the previous string (Block 1324). The previous code word is used as an index into the decompression dictionary. The previous code word's LOCATION POINTER (1002) and DEPTH (1004) are used to copy its string to the next uncompressed location (Block 1326) in the output data stream. Then the first symbol of the previous code words string is copied to the next uncompressed location in the output (Block 1328). Then, the decompressor checks to see if the code word from Block 1324 represents a 2 symbol string (Block 1330). This will be the first occurrence of the 2 symbol string since it is the next code word to be processed (Block 1324).

1. If the code word does represent a 2 symbol string (Block 1330), then the length field bit and length field are used to determine how many symbols to extend the string. This step is the same as done in Block 1322 (see step 2.B.1 above).

2. If the code word does not represent a 2 symbol string (Block 1330), then if the depth of the previous code word processed is equal to the maximum string length (Block 1332), the decompressor can't extend the string any further and goes to the step in Block 1348. If the depth is less than the maximum string length (Block 1332) go to the step in Block 1340.

E. If the code word is the EXTEND control code word (Block 1334), then the previous code word is used as an index into the decompression dictionary. The EXTEND control code word is then immediately followed by the extension length field which indicates how many symbols following the location pointed to by the previous code word's location pointer plus one to copy into the uncompressed output data (Block 1336).

F. If the code word is not the EXTEND control code word (Block 1334), then the code word is greater than the next sequential code word to be built, i.e., a multi-symbol extension string signaling code word. The previous code word is used as an index into the dictionary (Block 1338). The multi-symbol extension string signaling code word is subtracted from the next sequential code word to be built to obtain the number of symbols to extend the previous string. The previous code word's LOCATION POINTER (1002), pointing to the last symbol of its string, plus one, is the first of the number of extended symbols that are copied to the next location within the output data stream (Block 1338).

It should be noted that when the decompressor is extending a string defined by a code word by a certain number of symbols (see Blocks 1322, 1336 and 1338), that the same process is used to create the "from pointer". Thus, the previous code word is used an index into the decompression dictionary. The location pointer (1002) of the previous code word plus one points to the first symbol to extend the current string. That symbol (at location pointer plus one) and the number of symbols indicated by either 1) the length field bit and length field or 2) the extension length field or 3) the multi-symbol extension string signaling code word are copied to the next uncompressed location in the output.

3. Next, the decompressor then updates (Block 1340) the next location in the uncompressed location pointer 1002 in the decompression dictionary by the number of symbols placed into the output data stream during the processing of the code word.

4. The decompressor builds (Block 1342) an extension string to the string represented by the previous code word by using the next sequential decompression dictionary entry, following the last code word entry built, as follows:

A. Sets (Block 1344) the LOCATION POINTER (1002) to the last character placed or copied into the uncompressed data. The symbol identified by the LOCATION POINTER (1002) is the symbol preceding the next uncompressed location pointer 1002, updated in step 3, above.

B. Adds (Block 1346) the number of string extension symbols, which is one, unless the extension string is an extended string (i.e., as signaled by a multi-symbol extension string signaling code word), to the DEPTH (1004) of the previous code word and places the result into DEPTH (1004).

5. Starts over again by getting the next set of bits to process as shown in Block.

Figure 14:
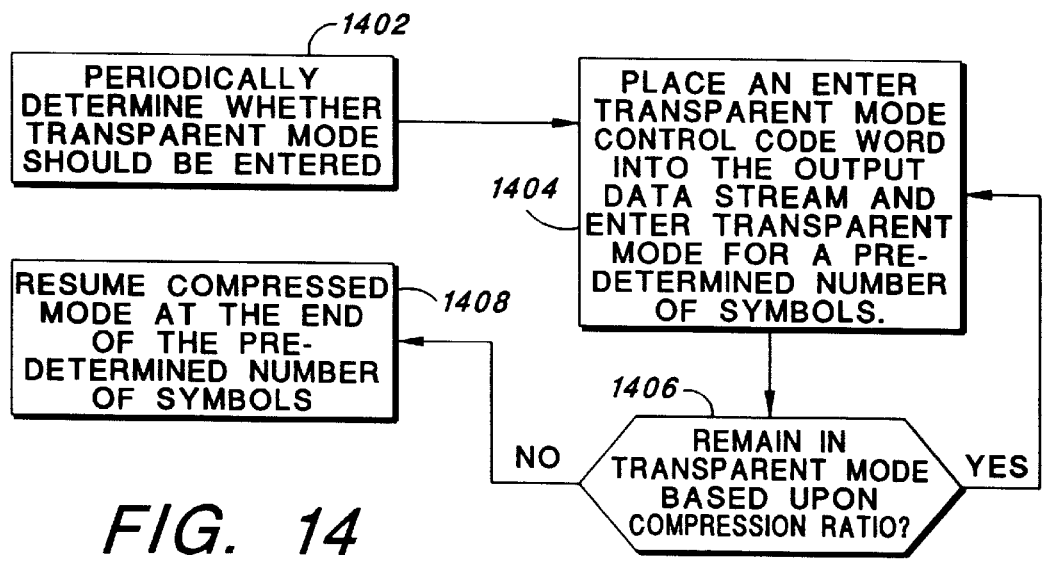
FIG. 14 is a flowchart of the steps for a compressor to enter a transparent mode while in compression mode.

Referring next to FIG. 14, a flowchart is shown for a method for the compressor to enter a transparent mode. In another embodiment, the compressor 18 shown in FIG. 1 can enter a transparent mode. A transparent mode in a compressor is known in the art. The compressor 18 is compressing an input data stream and the output data stream actually comprises more data than the input data stream. This is a special case in which the data to be compressed does not compress well and the compressor will enter a transparent mode, in which the input data stream is simply placed into the output data stream without being compressed.

Prior art methods, such as used by the V.42bis standard, typically check the compressibility of the data being compressed by periodically checking the compression ratio by comparing the input data stream with the output data stream. Once the compressor has determined that the data is not compressing well, the compressor places an "enter transparent mode" or ETM code word into the compressed data stream and then simply places the symbols in the input data stream directly into the output data stream without compressing. The decompressor receives the ETM code word and knows that the next symbols are not being compressed.

The difficulty in a prior art approach is that the compressor must send out an escape character (ESC) amongst the transparent characters in the output data stream. The escape character must be unique and distinguishable from the other transparent data placed in the output data stream. The escape character is one of the 256 possible symbols in an 8 bit symbol. Therefore, the compressor assigns one of the 256 possible symbols as the escape character. Thus, the decompressor must be able to recognize the escape character as an escape character, not a symbol to be passed transparently through the decompressor. Once the escape character is placed into the output, the decompressor knows to look at the next symbol instead of simply outputting it transparently. To enter compressed mode, an "enter compress mode" or ECM control character immediately follows. Thus, when the decompressor receives the escape character and looks at the next bits. If the next bits are an ECM control character, then the decompressor knows that the data stream now being received has been compressed by the compressor. Problems arise when the escape character itself is the symbol that is desired to be passed through transparently. For example, the escape character has been assigned the symbol representing the number "0". When a "0" is encountered in the input data stream, the compressor must place the escape character ("0") in the output data stream, then place another "0" in the output data stream. This tells the decompressor to place a "0" in the output of the decompressor. If several "0's" in a row are encountered, the compressor must send out the escape character prior to each occurrence of the "0" in the input data stream.

Note that the next bits following the escape character don't have to be an ECM code word, but could be other symbols or control characters used by other functions in the V.42bis standard. This is disadvantageous in that the decompressor has to be told when to exit the transparent mode and the compressor has to create and maintain an escape character that is uniquely known to the decompressor. Another disadvantage to the V.42bis standard is that in order to reset or reinitialize the compression dictionaries, the compressor must go to transparent mode and then send an escape character and then, a RESET code word.

The present embodiment improves the prior art methods known. First, the compressor determines whether the transparent mode should be entered (Block 1402). This is done conventionally by comparing the input data stream to the compressed data stream periodically. For example, once every 500 symbols, the compression ratio is checked.

If it is determined that the transparent mode should be entered, an ETM control code word ("enter transparent mode") is placed into the output data stream and the compressor switches to transparent mode for a predetermined number of symbols, e.g. 200 symbols (Block 1404). Thus, the compressor is in transparent mode for a predetermined number of symbols, whereas a prior art approach is for an unspecified number of symbols. At the end of the predetermined amount of symbol the compressor automatically re-enters compressed mode (Block 1408) without having to tell the decompressor that it is re-entering compressed mode. Thus, advantageously, no additional escape characters or ECM control characters need to be placed into the output data stream to tell the decompressor that the transparent mode is complete. The ETM control code word is another code word in the reserved sections of the code word dictionary of the compressor and the decompression dictionary of the decompressor. Thus, in embodiments using the ETM control code word, an additional entry is needed in the respective reserved sections.

Additionally, if the compressor wants to continue the transparent mode, i.e. remain in transparent mode, at the end of the predetermined number of symbols, the compressor checks the compression ratio of the data that it just passed through transparently. If the compressor determines that the input data stream still compresses poorly by checking the compression ratio (Block 1406), then the compressor sends out another ETM code word (Block 1404). The compressor is able to determine this because the compressor compresses the input data stream even though it is not outputting the compressed data. Thus, the compressor is compressing the input data stream so that it can compute a compression ratio by comparing the compressed data (not being output) to the data that was passed through transparently. Unless told to continue to be in transparent mode by the compressor, by an ETM code word, the decompressor automatically knows that the compressor will go back to compressed mode at the end of the predetermined amount of symbols.

Furthermore, in order to reset or reinitialize the dictionary, the compressor does not need to enter the transparent mode, and output an escape character, ECM and RESET code word. The dictionaries of the compressor and the decompressor are reinitialized whenever the entering compressed mode and transparent mode.

Results

Table 1, shown below, is a comparison using the different compression techniques. A C source file, a VAX EXE file, and an Intel LOC file were compressed. The technique used in Welch (V.42bis) was compared with Embodiment A, and Embodiment B using Improvements 1–2, 1–3, and 1–4. The comparison is by a percentage of the file compressed where bigger is better compression. "Frame" means compressing one frame at a time (for frame lengths of 250 and 1500 bytes), while "stream" means compressing continuous frames over a guaranteed link as defined by the V.42bis CITT standard. "Frame" used a 1024 entry dictionary and "stream" used a 4096 entry dictionary. Also note that compression ratios increase as the amount of data being compressed increases (frame 250 vs. frame 1500, etc.).

In this way, the present data compression system compresses and decompresses data so as to make more optimal use of available processing, time, storage space and bandwidth resources.

EXAMPLE III

Using, as an example data block, the string "COMPUTER", repeated 8 times in a data block with at least one intervening character between repetitions, the present approach builds 9 code words, extension strings and dictionary entries. For ease of understanding, intervening characters are not included in the example or figures. Code word dictionary 800 entries 1 through 8, i.e., 3h through Ah are built the 1st time 2 symbol strings are encountered, while an extension pointer is created in the root node dictionary 809 for any single character encountered, the extension pointer pointing to a location in the code word dictionary (e.g. the root node dictionary entry for "C" points to code word 3h in the code word dictionary which defines the string "CO", and so on). The 2nd time a string ("CO") is encountered; thus, the first time matched, the string is extended, if possible (preferably by more than one symbol). The 2nd time "CO" occurs, code word dictionary entry 3h is extended by 6 characters, i.e., Bh, whose code word represents all 8 characters, i.e., the first dictionary entry (3h), which represents "CO" extended by six additional characters, "NMPUTER". As a result, the compression ratio is improved by assigning a code word that represents a complete string the 2nd time it is encountered. This differs from the prior approach, for example, of U.S. Pat. No. 4,558,302 (Welch, et al.) in which a string is extended by only one symbol each time it is encountered. The present approach builds the code words, string extensions, and string table entries shown in FIGS. 8A, 8B, and 9 while compressing the example data block and builds the code words shown in FIGS. 10 and 11 while decompressing the example data block.

In contrast to the earlier approach described in the '302 patent, the present approach generates the following compressed output in response to the first 8 occurrences of the word "COMPUTER" in the example data block:

TABLE 1

TEST RESULTS: Compression Ratios

|  | V.42bis | Embodiment A* | Embodiment B Improvements 1 and 2 | Embodiment B Improvements 1, 2, and 3 | Embodiment B Improvements 1, 2, 3, and 4 |
|---|---|---|---|---|---|
| C File |  |  |  |  |  |
| 250 frame | 25.2 | 32.5 | 34.1 | 35.3 | 40.7 |
| 1500 frame | 43.1 | 52.9 | 54.9 | 55.7 | 58.0 |
| stream | 62.9 |  | 72.2 | 70.8 | 71.2 |
| EXE file |  |  |  |  |  |
| 250 frame | 19.8 | 25.0 | 26.4 | 27.4 | 27.5 |
| 1500 frame | 28.3 | 33.0 | 35.0 | 37.7 | 37.7 |
| stream | 29.9 |  | 36.9 | 40.9 | 40.9 |
| LOC file |  |  |  |  |  |
| 250 frame | 11.2 | 15.9 | 17.2 | 18.0 | 18.1 |
| 1500 frame | 20.8 | 25.1 | 26.9 | 30.7 | 30.7 |
| stream | 25.1 |  | 29.1 | 35.1 | 35.1 |

*Embodiment A does not have a stream mode.

| 1st Time | 2nd Time | 3rd Time | 4th Time | 5th Time | 6th Time | 7th Time | 8th Time |
|---|---|---|---|---|---|---|---|
| COMPUTER | 3h[011010] | Bh | Bh | Bh | Bh | Bh | Bh |

Note that in accordance with the with "Improvement 3", each time a single character is output, an "0" identifying bit (not shown) is placed before the 8 bit single character word (e.g. [0]C [0]O), or 7 bit single character word (if using Improvement 4). Also, a "1" identifying bit (not shown) is placed before any extension signaling code words (e.g. [1]3h). Thus, the decompressor knows whether the bits following the identifying bit are a single character or a code word.

Note also that a length field bit and length field [011010] replace the multi-symbol extension string signaling code word (which would be [10h] in this example using the method of the previous embodiment) in output on the 2nd occurrence. Since the set flag indicates that this is the second occurrence of the 2 symbol string, the decompressor knows to look for the special length field bit and not the identifying bit. A length field bit of "0" indicates that the string is extended up to 11 characters. The number of characters in the extension is indicated by the length field ("11010"), The first two bits of the length field "11" indicate an extension from 4 to 11 characters, and the last three bits "010" indicate that the string was extended by 6 characters (MPUTER), in accordance with "Improvement 2". This technique saves bits since most code words will be longer than the 6 bits output in this case. If the string was extended more than 11 characters, then a multi-symbol extension string signaling code word as described above in EXAMPLE I or block 1234 of FIG. 12B is used.

At the same time an entry for code word Bh is built representing the 6 character extension string or new longest data string ("COMPUTER"). The location pointer and count are entered for code word Bh, and the extension pointer of 3h points to Bh. Thus, the next time the string is encountered, simply Bh is output. An exemplary code word dictionary and root node dictionary built in accordance with the present example are shown in FIGS. 8A and 8B. An exemplary input data stream and an exemplary compressed data stream in accordance with the present example are shown in FIGS. 9 and 11. An exemplary decompression dictionary built in accordance with the present example is shown in FIG. 10.

The decompressor knows whether the received bits represent a single character or a code word by the leading identifying bit. Note that when the decompressor receives, code word 3h, it copies the two symbols from location 0 to the next uncompressed location, which at that time is location 9. Further note that since the code word represented by 3h is a 2 symbol string seen for the first time, so the next bits represent the length field bit and the length field. The next bits [011010] immediately following determine an extension length of 6 based on "Improvement 2". The decompressor then uses the next location in the output data stream, past the end of the previous code word received, i.e., location 2, which is past the end of the dictionary entry for code word 3h, and copies six symbols from location 2 to the next uncompressed location which is now location Bh. It then creates a dictionary entry for the extended code word, code word Bh, by adding the extension length of 6 to the length of the previous code word received, i.e., 2, for a depth of 8, and places a pointer to the symbol copied into location 10e In this example, the present approach reduces the number of string extension table entries and code words built from 22 (in accordance with the approach taken in the '302 patent) to 9 (in accordance with the Embodiment A and the Embodiment B). In addition, the present approach reduces the compressed output from 26 code words (in accordance with the approach taken in the '302 patent) and from 16 code words (in accordance with the Embodiment A) to 8 code words and 8 single characters for all eight occurrences of the word COMPUTER. Thus, the present approach represents a substantial improvement over the prior art and depending on the compressibility of the stream, provides an improvement over Embodiment A.

Just as in EXAMPLE 1, in accordance with the preferred embodiment, sequential repeating patterns are compressed very efficiently. This is true for a single symbol sequential repeating pattern, such as a string of up to 255 "A" characters, or a multiple symbol sequential repeating pattern such as "ABCABCABCABCABCABC". After a first iteration of the repeating pattern is processed it can be extended to its maximum useful length with two additional code words using the extended string mechanism described herein. The sequential repeating patterns are processed in the normal way by extending the string. It is efficient because after the first iteration of the repeating pattern is processed the entire string can be extended. After the first A is processed, compare the character following the first A with those following the second A up to the next 254 characters are equal (i.e., the same) so the string is extended by up to 254. The compressor copies the 1st A to the second, second to third, third to fourth, etc. up to 255 times to recreate the string. For the string, ABCABCABCABCABCABC, when the second occurrence of AB is compressed using its code word of 3h, the character following the dictionary entry (3h), which is the first C, is compared to the next character to compress, the second C, and all characters will be equal since it is an overlapping sequence, thus the string is extended by the length of the pattern minus five. The present embodiment can represent the above single character sequential repeating pattern (up to 255 "A" characters) with three code words and the multiple character sequential repeating pattern ("ABCABCABCABCABCABC") with five code words. The decompressor 22 automatically handles sequential repeating patterns, without special accommodations.

EXAMPLE IV

With multiple symbol string extensions, the preferred Embodiment B can represent a very long single symbol sequential repeating pattern (over 255) with 3 code words. For example, if a data block starts with 500 duplicated "A" symbols (a 41h in ASCII), the present approach generated a compressed output consisting of single character "A" and code words 3h, and 1F5h. These code words represent 1, 2, and 497 "A"s respectively. In the process, the compressor builds only two code words and string extension dictionary entries, i.e., for 3h, which extends "A" by one additional character and for 4h, which extends 3h by 497 additional characters, 1F5h is a multi-symbol extension string signaling code word since it is greater than 11 symbols (4h, which is the next available code word, plus 497 additional symbols).

Thus, in accordance with the embodiments disclosed herein, a vast improvement over conventional and heretofore known data compressions systems is abandoned, both in terms of compressor efficiency and compression speed.

While the invention herein disclosed has been described by means of specific embodiments and applications thereof, numerous modifications and variations could be made thereto by those skilled in the art without departing from the scope of the invention set forth in the claims.

What is claimed is:

1. A method of data compression for transmission over a communications channel comprising:
   receiving one or more data symbols comprising a current data string and at least one subsequent symbol;
   matching a longest previous data string with the current data string, the longest previous data string being defined by a code word;
   placing the code word into a compressed data stream; and
   extending the current data string by a plurality of symbols.

2. The method of claim 1 further comprising:
   placing, in the event the current data string is the second occurrence of a two symbol string, a length field indicative of the plurality of symbols into the compressed data stream;
   placing, in the event the current data string is not the second occurrence of the two symbol string, a multi-symbol extension string signaling code word indicative of the plurality symbols into the compressed data stream; and
   transmitting the compressed data stream through the communications channel.

3. The method of claim 2 wherein said placing, in the event said current data string is not the second occurrence of said two symbol string comprises placing, in the event said current data string is not the second occurrence of said two symbol string and said multi-symbol extension string signaling code word would cross a current code word size boundary, an extend control code word and an extension length field indicative of said plurality of symbols into said compressed data stream.

4. The method of claim 1 further comprising acing an identifying bit into the compressed output prior said placing said code word step, the identifying bit indicating that the following bits represent said code word.

5. The method of claim 1 wherein said receiving comprises said receiving said one or more data symbols comprising said current data string, wherein said current data string is a multiple symbol string.

6. The method of claim 1 wherein said matching comprises said matching, using a compression dictionary, said current data string with said longest previous data string.

7. The method of claim 1 further comprising comparing said at least one subsequent symbol following said current data string with at least one subsequent symbol following said longest previous data string, prior to said extending step; and
   wherein said extending comprises said extending, in the event said at least one subsequent symbol following said current data string equals said at least one subsequent symbol following said longest previous data string, said current data string by said plurality of symbols.

8. The method of claim 1 wherein said receiving comprises said receiving said one or more data symbols comprising said current data string and said at least one subsequent symbol, wherein said at least one subsequent symbol comprises said plurality of symbols.

9. The method of claim 1 further comprising forming a new longest data string defined by a new code word, the new longest data string indicative of said longest previous data string and said plurality of symbols.

10. The method of claim 9 wherein said forming comprises said forming said new longest data string defined by a next sequential undefined code word.

11. The method of claim 10 further comprising:
    linking said new longest data string associated with said plurality of symbols to said longest previous data string by:
       placing a created extension code word in an extension pointer associated with said longest previous data string;
       defining a count indicative of a number of symbols in said plurality of symbols, the count associated with said new longest data string; and
       defining a location pointer to a first symbol of said plurality of symbols, the location associated with said new longest data string.

12. The method of claim 1 wherein said placing said multi-symbol extension string signaling code word comprises said placing said multi-symbol extension string signaling code into said compressed data stream, said multi-symbol extension string signaling code word is a previously undefined code word offset by a next sequential code word to be defined by a number of symbols in said plurality of symbols.

13. A method of data compression for transmission over a communications channel comprising:
    receiving one or more data symbols comprising a current data string;
    matching a longest previous data string with the current data string;
    placing, in the event the longest previous data string having been matched is a single symbol, the single symbol into a compressed data stream;
    placing, in the event the longest previous data string having been matched is a multiple symbol data string, a code word into the compressed data stream, wherein the code word is indicative of the longest previous data string; and
    transmitting the compressed data stream through the communications channel.

14. The method of claim 13 further comprising placing an identifying bit into the compressed data stream prior to both said placing steps, the identifying bit indicating whether the following bits are said single symbol or said code word.

15. The method of claim 13 further comprising
    extending said current data string having been matched by a plurality of symbols, whereby forming a new longest data String.

16. The method of claim 15 further comprising placing, in the event the longest previous data string is a two symbol string encountered for the second time, a length field indicative of said plurality of symbols.

17. The method of claim 15 further comprising placing a multi-symbol extension string signaling code word indicative of said plurality of symbols into said compressed data stream.

18. The method of claim 15 further comprising placing, in the event a multi-symbol extension string signaling code word would cross a current code word size boundary, an extend control code word and an extension length field indicative of said plurality of symbols into said compressed data stream.

19. The method of claim 13 further comprising:
    assuming each of said one or more symbols is an ASCII symbol, such that single symbol strings will be represented by 7 bits;
    placing, in the event one of said one or more symbols is not the ASCII symbol, a stepup code word in the compressed data stream, wherein the stepup code word indicates that subsequent single symbol strings will be represented by 8 bits.

20. A method for decompressing data received over a communications channel comprising;

receiving a plurality of bits;

determining whether the plurality of bits represents a single symbol or a code word;

placing, in the event the plurality of bits represents the single symbol, the single symbol into an output data stream; and placing, in the event the plurality of bits represents the code word, a data string defined by the code word into the output data stream.

21. The method of claim 20 wherein said receiving comprises receiving an identifying bit and a plurality of subsequent bits.

22. The method of claim 20 wherein said determining comprises determining, using said identifying bit, whether said plurality of subsequent bits represents said single symbol or said code word.

23. The method of claim 20 further comprising:

determining, in the event said plurality of bits represents said code word, whether said code word is defined by a decompressor;

placing, in the event said code word is defined by the decompressor, said data string defined by said code word into said output data stream;

determining, in the event said code word is not defined by the decompressor, whether said code word is a next code word to be defined;

placing, in the event said code word is the next code word to be defined, a string into said output data stream, the string being copied from a location indicated by a previous code word processed and placing a first symbol of the string into said output data stream; and placing, in the event said code word is not defined by the decompressor and is not the next code word to be defined, an extension string into said output data stream, the extension string being copied from said output data stream at a symbol following a last symbol of the previous code word processed.

24. The method of claim 23 wherein said determining, in the event said plurality of bits represents said code word, comprises said determining, in the event said plurality of bits represents said code word, whether said code word is defined by said decompressor in a decompression dictionary.

25. The method of claim 23 wherein said placing, in the event said code word is not defined by said decompressor and is not said next code word to be defined comprises said placing said extension string being copied from said output data stream at said symbol following said last symbol of said previous code word processed, wherein a length of said extension string is the difference between a received multi-symbol extension string signaling code word and a next sequential code word to be defined.

26. The method of claim 23 wherein said placing, in the event said code word is said next code word to be defined comprises:

determining whether said code word represents a two symbol string being encountered for a first time by said decompressor; and placing, in the event said code word is a two symbol string being encountered for the first time by said decompressor, said extension string into said output data stream, said extension string being copied from said output data stream at said symbol following said last symbol of the code word, wherein a length of said extension string is determined from a received length field.

27. A data compression system for compressing data to be transmitted through a communications channel comprising:

means for receiving one or more data symbols comprising a current data string and at least one subsequent symbol;

compression means comprising:

means for matching a longest previous data string with the current data string, the longest previous data string being defined by a code word;

means for placing the code word into a compressed data stream; and means for extending the current data string by a plurality of symbols.

28. The data compression system of claim 27 further comprising:

means for placing, in the event the current data string is the second occurrence of a two symbol string, a length field indicative of the plurality of symbols into the compressed data stream; and means for placing, in the event the current data string is not the second occurrence of the two symbol string, a multi-symbol extension string signaling code word indicative of the plurality symbols into the compressed data stream; and means for transmitting the compressed data stream through the communications channel.

29. A data decompression system for decompressing a compressed data stream received through a communications channel comprising:

means for receiving a plurality of bits;

means for determining whether the plurality of bits represents a single symbol or a code word;

means for placing, in the event the plurality of bits represents the single symbol, the single symbol into an output data stream; and means for placing, in the event the plurality of bits represents the code word, a data string defined by the code word into the output data stream.

30. An adaptive compression dictionary to be used for compressing data to be transmitted through a communications channel comprising:

a code word dictionary comprising:

an extension pointer for pointing to a code dictionary entry that defines an extension string to a currant string wherein the extension string is one or more symbols;

a parallel pointer for pointing to a code word dictionary entry that defines a parallel extension string to the current string, wherein the parallel extension string is one or more symbols;

a location pointer for pointing to a location of a first symbol of the extension string or the parallel extension string in a previously compressed area of an input data stream; and a count indicative of a number of symbols in, the extension string or the parallel extension string; and a root node dictionary comprising:

a root extension pointer for pointing to a code word dictionary entry that defines an extension string to a single symbol, wherein the extension string is one symbol.

31. A method for a compressor and decompressor to enter and exit a transparent mode in a data compression system comprising:

determining whether the transparent mode should be entered;

placing, in the event the transparent mode is to be entered, an enter transparent mode control code word into an output data stream;

placing a predetermined number of symbols received from an input data stream into the output data stream, wherein the predetermined number of symbols are uncompressed in the output data stream; and reentering a compression mode after the placing the predetermined number of symbols step.

32. The method of claim 31 further comprising:

determining whether to remain in said transparent mode at the end of said predetermined number of symbols;

repeating said placing said enter transparent mode code word step, said placing said predetermined number of symbols, and said reentering step, in the event of remaining in said transparent mode.

* * * * *